United States Patent
Hsu et al.

(10) Patent No.: US 11,943,939 B2
(45) Date of Patent: Mar. 26, 2024

(54) INTEGRATED CIRCUIT DEVICE AND METHOD

(71) Applicant: TAIWAN SEMICONDUCTOR MANUFACTURING COMPANY, LTD., Hsinchu (TW)

(72) Inventors: Meng-Kai Hsu, Hsinchu (TW); Jerry Chang Jui Kao, Hsinchu (TW); Chin-Shen Lin, Hsinchu (TW); Ming-Tao Yu, Hsinchu (TW); Tzu-Ying Lin, Hsinchu (TW); Chung-Hsing Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 277 days.

(21) Appl. No.: 17/140,441

(22) Filed: Jan. 4, 2021

(65) Prior Publication Data

US 2022/0216270 A1 Jul. 7, 2022

(51) Int. Cl.
*H10K 19/10* (2023.01)
*H01L 21/822* (2006.01)
*H01L 27/06* (2006.01)
*H01L 49/02* (2006.01)
*H10K 19/00* (2023.01)

(52) U.S. Cl.
CPC ........... *H10K 19/10* (2023.02); *H01L 21/822* (2013.01); *H01L 27/0688* (2013.01); *H01L 28/10* (2013.01); *H01L 28/40* (2013.01); *H10K 19/201* (2023.02)

(58) Field of Classification Search
CPC ..... H01L 27/283; H01L 27/281; H01L 28/10; H01L 28/40; H01L 27/0688; H01L 21/822
See application file for complete search history.

(56) References Cited

U.S. PATENT DOCUMENTS

| | | | | |
|---|---|---|---|---|
| 6,163,042 A | * | 12/2000 | Mizushima | ......... H01L 27/0207 257/202 |
| 6,407,434 B1 | * | 6/2002 | Rostoker | ............. H01L 23/5222 257/E29.022 |
| 7,260,442 B2 | | 8/2007 | Hwang et al. | |
| 8,689,160 B2 | * | 4/2014 | Lin | ........................ G06F 30/394 716/113 |
| 9,159,743 B2 | * | 10/2015 | Crandall | ............... H04B 1/3827 |
| 9,256,709 B2 | | 2/2016 | Yu et al. | |
| 9,558,809 B1 | * | 1/2017 | Liaw | ...................... G11C 11/412 |
| 9,805,994 B1 | * | 10/2017 | Lam | ........................ H01L 22/32 |
| 11,281,836 B2 | * | 3/2022 | Chang | ................. H01L 27/0207 |
| 2009/0134467 A1 | * | 5/2009 | Ishida | ................. H01L 29/7835 257/E21.409 |

(Continued)

*Primary Examiner* — Ahmed N Sefer
(74) *Attorney, Agent, or Firm* — Hauptman Ham, LLP

(57) ABSTRACT

An integrated circuit (IC) device includes a substrate and a circuit region over the substrate. The circuit region includes at least one active region extending along a first direction, at least one gate region extending across the at least one active region and along a second direction transverse to the first direction, and at least one first input/output (IO) pattern configured to electrically couple the circuit region to external circuitry outside the circuit region. The at least one first IO pattern extends along a third direction oblique to both the first direction and the second direction.

20 Claims, 17 Drawing Sheets

(56) References Cited

U.S. PATENT DOCUMENTS

| | | | |
|---|---|---|---|
| 2013/0283224 A1* | 10/2013 | Lin | G06F 30/398 |
| | | | 716/113 |
| 2014/0040838 A1 | 2/2014 | Liu et al. | |
| 2014/0137061 A1* | 5/2014 | McIlrath | G06F 30/30 |
| | | | 716/112 |
| 2014/0306296 A1* | 10/2014 | Jeon | H01L 21/76895 |
| | | | 438/283 |
| 2015/0249111 A1* | 9/2015 | Kang | G11C 11/1659 |
| | | | 710/308 |
| 2015/0278429 A1 | 10/2015 | Chang | |
| 2015/0380325 A1* | 12/2015 | Kindereit | G01R 31/311 |
| | | | 257/48 |
| 2016/0268243 A1* | 9/2016 | Lee | H01L 27/0207 |
| 2016/0300839 A1* | 10/2016 | Kim | H01L 23/528 |
| 2017/0117272 A1* | 4/2017 | Sio | H01L 23/5283 |
| 2017/0141029 A1* | 5/2017 | Guo | H01L 27/0207 |
| 2017/0345754 A1* | 11/2017 | Yun | H01L 23/528 |
| 2019/0121929 A1* | 4/2019 | Chen | G06F 30/392 |
| 2019/0155984 A1* | 5/2019 | Chen | G06F 30/398 |
| 2019/0181130 A1* | 6/2019 | Do | H01L 27/11807 |
| 2019/0227963 A1* | 7/2019 | Ooi | G06F 30/34 |
| 2019/0355712 A1* | 11/2019 | Yoshida | G11C 11/419 |
| 2020/0168700 A1* | 5/2020 | Song | H01L 29/0642 |
| 2020/0303307 A1* | 9/2020 | Jang | H01L 23/5226 |
| 2020/0321355 A1* | 10/2020 | Jeong | H01L 27/0207 |
| 2021/0013149 A1* | 1/2021 | Lee | H01L 27/11807 |
| 2021/0183859 A1* | 6/2021 | Jeong | H01L 29/42392 |
| 2021/0265335 A1* | 8/2021 | Liaw | G11C 8/16 |
| 2021/0327812 A1* | 10/2021 | Jang | G11C 11/24 |
| 2022/0092249 A1* | 3/2022 | Lee | G06F 30/392 |
| 2022/0130760 A1* | 4/2022 | Wu | H01L 29/0696 |
| 2022/0246599 A1* | 8/2022 | Chang | H01L 29/78645 |
| 2022/0359491 A1* | 11/2022 | Chen | H01L 27/092 |

\* cited by examiner

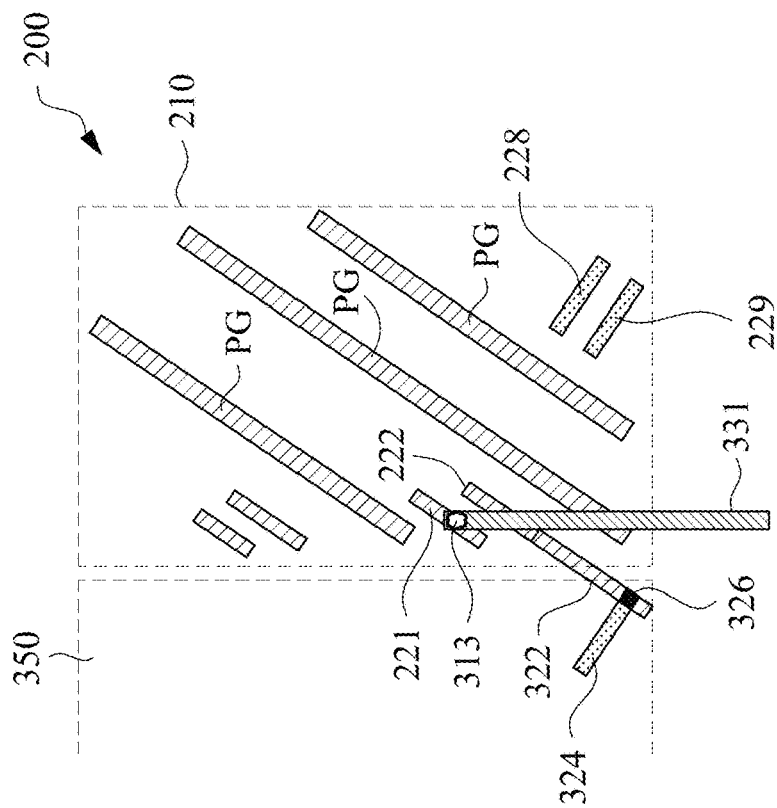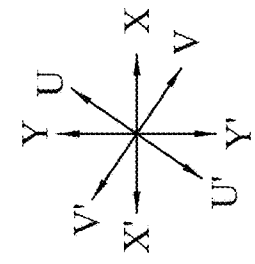
Fig. 3B
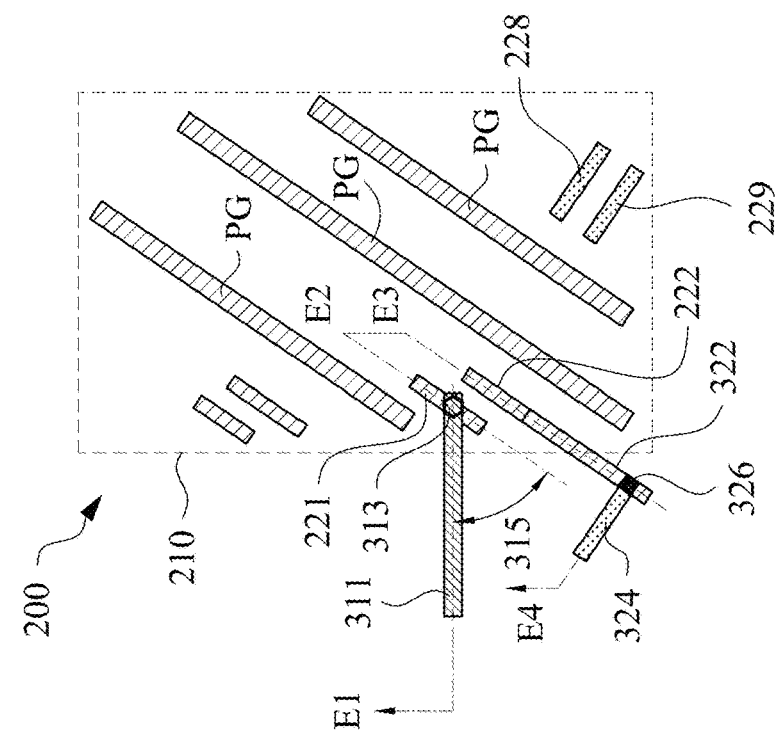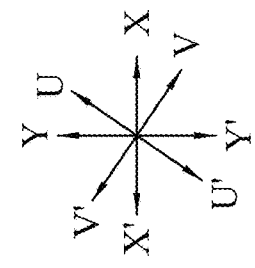
Fig. 3A

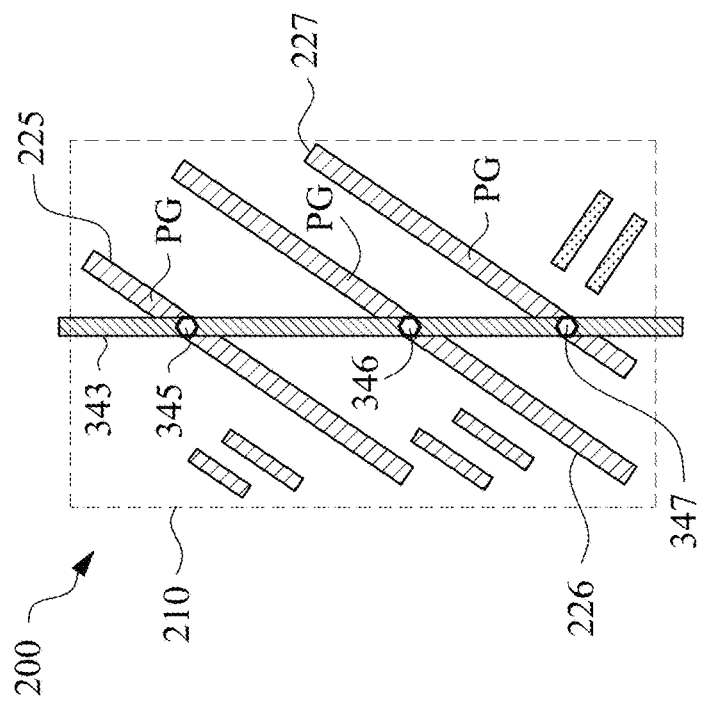
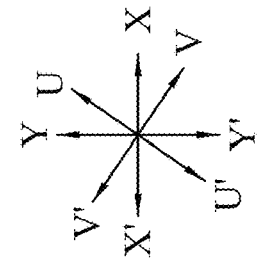
Fig. 3D
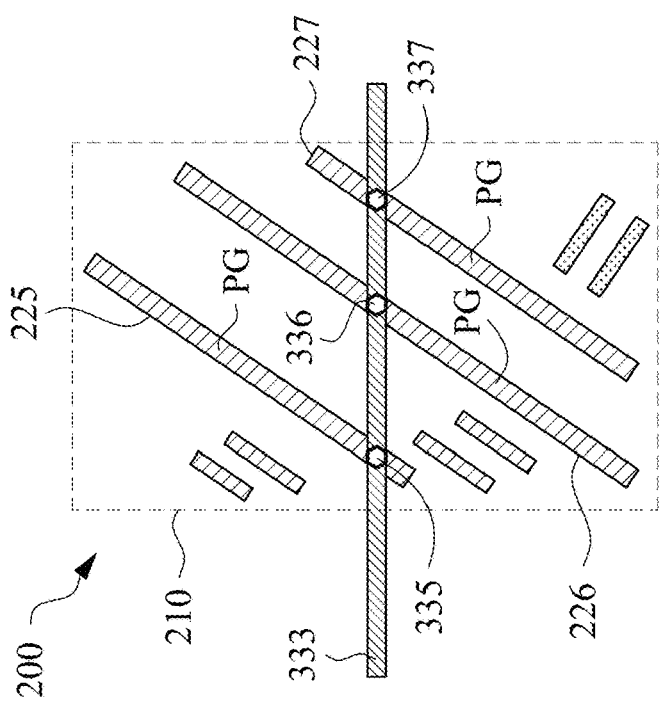
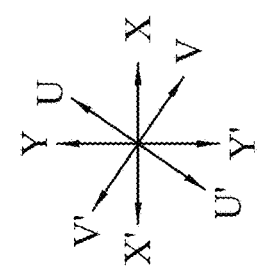
Fig. 3C

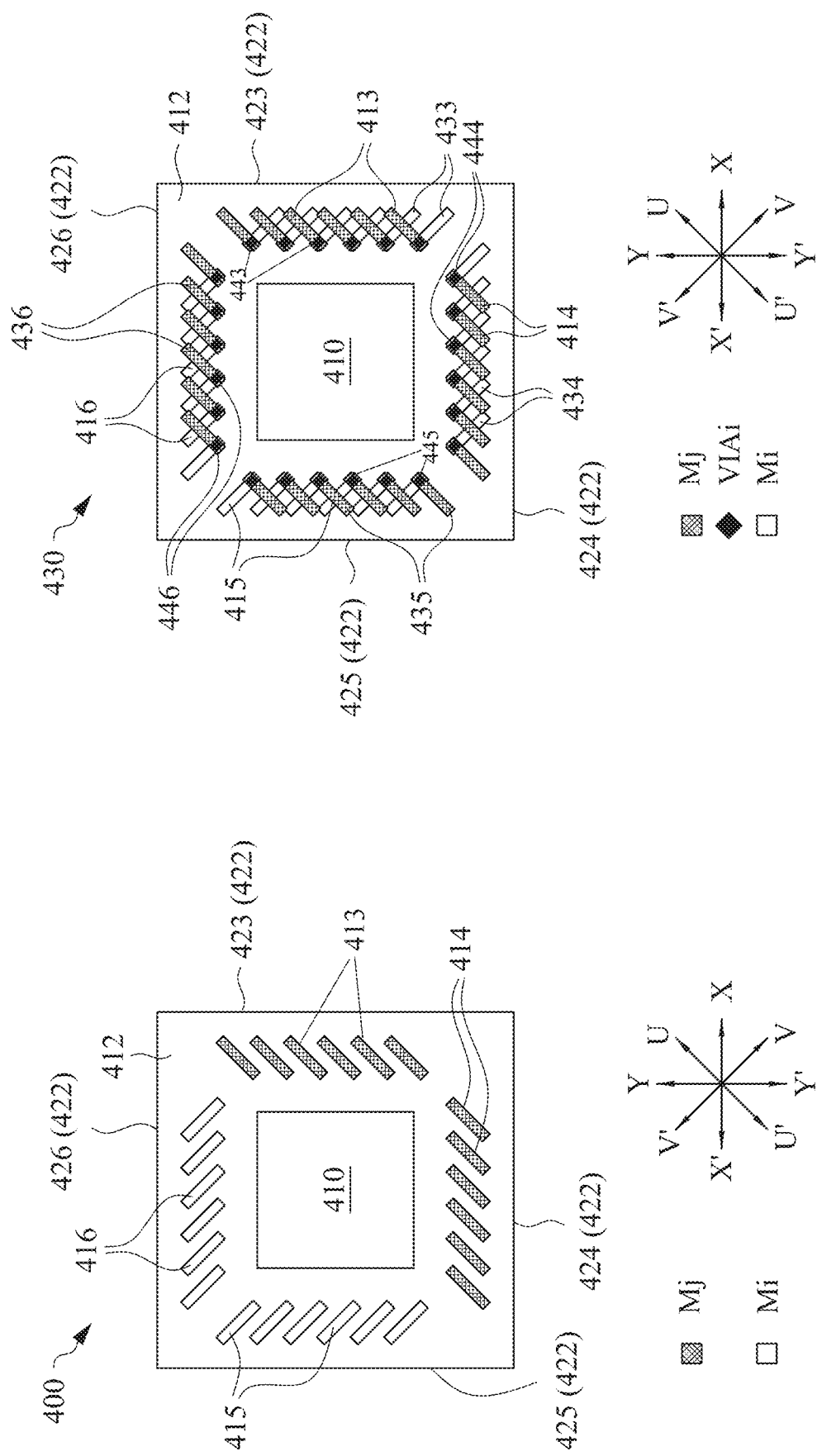

INTEGRATED CIRCUIT DEVICE AND METHOD

BACKGROUND

An integrated circuit (IC) device typically includes a number of circuit elements represented in an IC layout diagram. An IC layout diagram is hierarchical and includes modules configured to carry out functions in accordance with the IC device's design specifications. Modules are often built by different designers. Effective integration of various modules built by different designers into an IC device is a consideration in IC device design and/or manufacture processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3D are schematic views showing various routing arrangements for a circuit region in an IC device, in accordance with some embodiments.

FIGS. 4A-4B are schematic views of various cores, in accordance with some embodiments.

DETAILED DESCRIPTION

Figure 1:
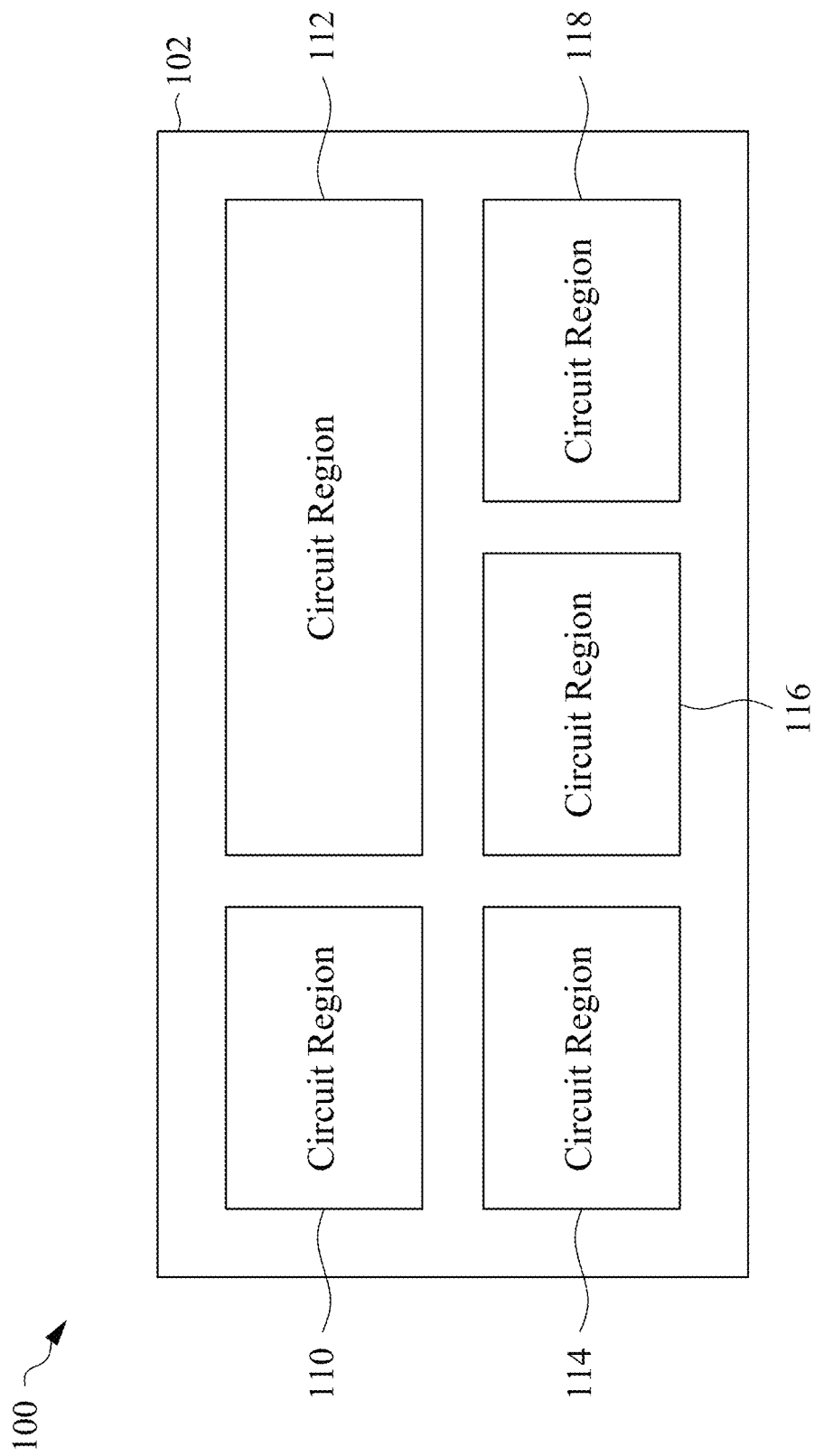
FIG. 1 is a schematic view of an IC device, in accordance with some embodiments.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integration of various modules built by different designers into an IC device is potentially a challenging task, due to different metal schemes used by different designers. A metal scheme includes various specifications including, but not limited to, a direction of metal patterns in a metal layer, a pitch between adjacent metal patterns, or the like. Horizontal and vertical metal schemes with correspondingly horizontal and vertical metal directions of metal patterns are often used for integrating or coupling different modules. In some embodiments, a module (also referred to as "circuit region") has IO pins (also referred to as "IO patterns") which are oblique to both the horizontal metal direction and the vertical metal direction. As a result, it is easier in at least one embodiment to integrate modules, and/or to reuse modules for various metal schemes.

FIG. 1 is a schematic view of an IC device 100, in accordance with some embodiments.

The IC device 100 comprises a substrate 102, and at least one circuit region over the substrate 102. In the example configuration in FIG. 1, the IC device 100 comprises circuit regions 110, 112, 114, 116, 118 over the substrate 102. The number of five circuit regions 110, 112, 114, 116, 118 is an example. Other numbers of circuit regions over a substrate are within the scopes of various embodiments.

In some embodiments, the substrate 102 is a semiconductor material (e.g., silicon, doped silicon, GaAs, or another semiconductor material). In some embodiments, the substrate 102 is a P-doped substrate. In some embodiments, the substrate 102 is an N-doped substrate. In some embodiments, the substrate 102 is a rigid crystalline material other than a semiconductor material (e.g., diamond, sapphire, aluminum oxide ($Al_2O_3$), or the like) on which an IC is manufactured. In some embodiments, N-type and P-type dopants are added to the substrate 102 to form one or more circuit elements as described herein.

Each of the circuit regions 110, 112, 114, 116, 118 comprises at least one cell. Each cell represents one or more semiconductor structures configured to perform a specific function. Cells having pre-designed layout diagrams, sometimes known as standard cells, are stored in standard cell libraries (hereinafter "libraries" or "cell libraries" for simplicity) and accessible by various tools, such as electronic design automation (EDA) tools, to generate, optimize and verify designs for IC devices. Each cell includes one or more circuit elements and/or one or more nets. A circuit element is an active element or a passive element. Examples of active elements include, but are not limited to, transistors and diodes. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), FinFETs, planar MOS transistors with raised source/drains, or the like. Examples of passive elements include, but are not limited to, capacitors, inductors, fuses, resistors, or the like. Examples of nets include, but are not limited to, vias, conductive pads, conductive traces (also referred to herein as "patterns"), and conductive redistribution layers, or the like. In some embodiments, each of the circuit regions 110, 112, 114, 116, 118 comprises a combination of cells electrically coupled together to perform at least one corresponding function of the IC device 100. The circuit regions 110, 112, 114, 116, 118 are electrically coupled together to perform various functions of the IC device 100.

In some embodiments, at least one of the circuit regions 110, 112, 114, 116, 118 comprises an intellectual property (IP) block. An IP block comprises a cell or a combination of cells developed by an IC designer (also referred to as "IP provider"). In some situations, an IP designer is a fabless design house or design company which designs, but does not manufacture, IC devices. In some situations, an IP designer is a foundry that designs and manufactures IC devices. An IP designer develops various IP blocks with corresponding different functions, and stores the developed IP blocks in an IP library. Different IC designers develop different IP libraries. It is possible that the same component with the same function is developed by different IC designers and corresponds to different IP blocks. IP blocks are reusable and selectable by a user to integrate the selected IP blocks into an IC device. It is possible that a user selects IP blocks from different IP designers or IP libraries to be integrated into an IC device.

In some embodiments, at least one of the circuit regions 110, 112, 114, 116, 118 comprises a non-IP block. A non-IP block comprises a cell or a combination of cells, but is not retrieved from an IP library. For example, a non-IP block is built from standard cells retrieved from a standard library, and/or developed specifically for a particular IC device.

In some embodiments, at least one of the circuit regions 110, 112, 114, 116, 118 comprises a core. A core comprises one or more IP blocks and/or one or more non-IP blocks integrated together. A core built from IP blocks of the same IP designer is sometimes referred to as an IP core. In at least one embodiment, multiple cores are arranged side-by-side on the same substrate, as described herein. In one or more embodiments, multiple cores are stacked one on top another, as also described herein.

Examples of cells include, but are not limited to, inverters, adders, multipliers, logic gates (such as NAND, XOR, NOR or the like), phase lock loops (PLLs), flip-flops, multiplexers, or the like. Examples of IP blocks and/or cores include, but are not limited to, memories, memory control logics, caches, resistor arrays, capacitor arrays, communications interfaces, application programming interfaces (APIs), analog to digital (A/D) converters, radio frequency tuners, digital signal processors (DSPs), graphics processing units (GPUs), arithmetic logic units (ALUs), floating-point units (FPUs), central processing units (CPUs), system-on-chips (SoCs), or the like.

In some embodiments, each circuit region comprises one or more IO pins (or IO patterns) to electrically couple circuitry in the circuit region to external circuitry, such as another circuit region in the same IC device or an external device outside the IC device. An EDA tool, such as an Automatic Placement and Routing (APR) tool, generates an IC layout diagram from a design of the IC device by placing various circuit regions of the IC device in a floor plan, and routing various nets to interconnect the IO patterns of the placed circuit regions. In other words, the APR tool integrates various circuit regions into the IC device. Some embodiments provide an IO pin layout structure that, in at least one embodiment, makes it easier for an APR tool to integrate various circuit regions than other approaches.

Figure 2:
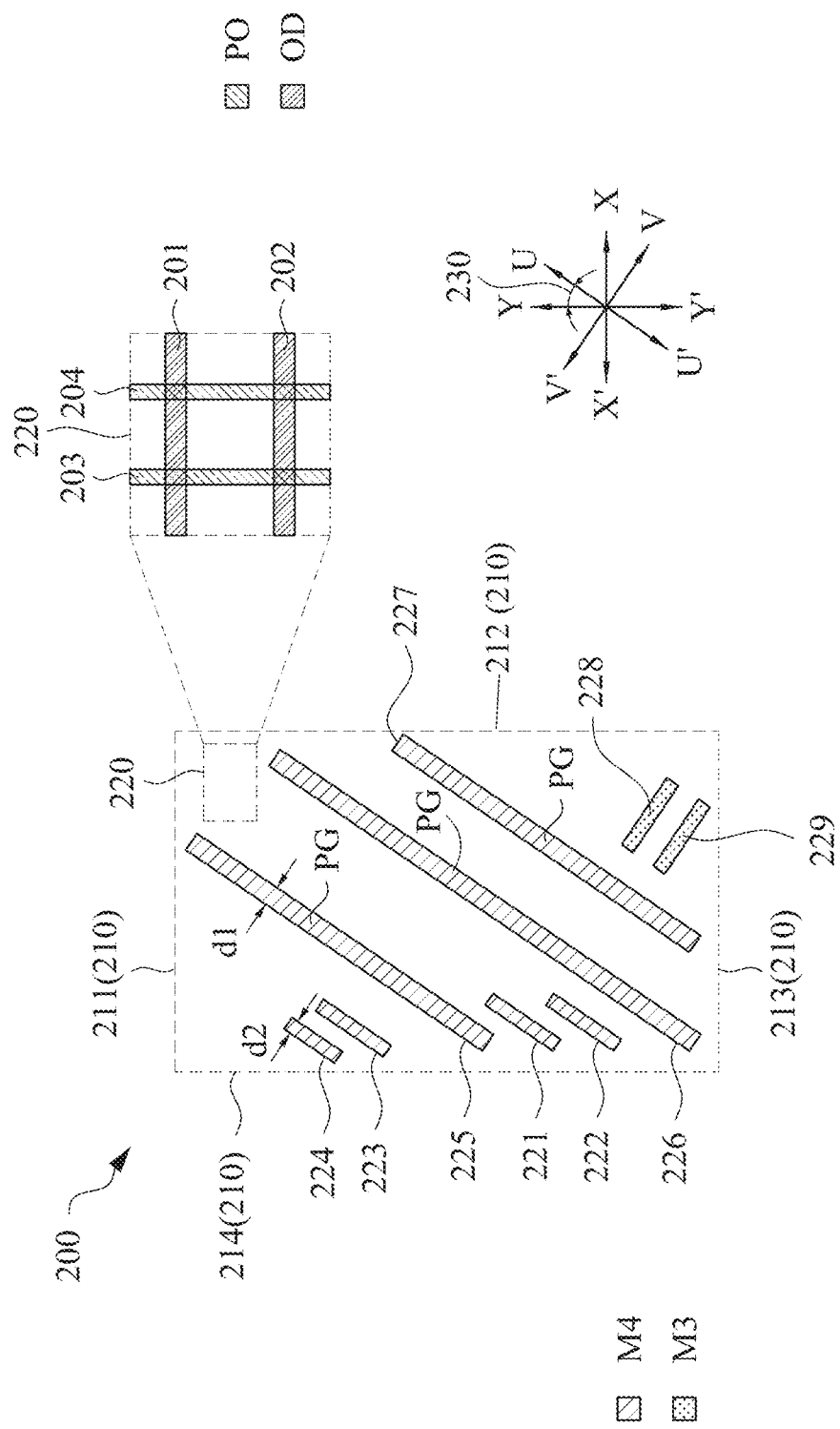
FIG. 2 is a schematic view of an IC layout diagram of a circuit region, in accordance with some embodiments.

FIG. 2 is a schematic view of an IC layout diagram of a circuit region 200, in accordance with some embodiments. In at least one embodiment, the circuit region 200 corresponds to one or more of the circuit regions 110, 112, 114, 116, 118. In at least one embodiment, an IC device manufactured according to the IC layout diagram of the circuit region 200 comprises physical and electrical configurations of the circuit region 200 as described herein.

The circuit region 200 comprises a boundary 210 within which various circuit elements and/or nets of the circuit region 200 are arranged. In the example configuration in FIG. 2, the boundary 210 is rectangular and comprises sides 211-214. The described shape and number of sides of the boundary 210 are examples. Other configurations are within the scopes of various embodiments.

The circuit region 200 comprises at least one active region extending along a first direction, and at least one gate region extending across the at least one active region and along a second direction transverse to the first direction. For example, as shown in the enlarged view of a section 220 of the circuit region 200 in FIG. 2, the circuit region 200 comprises active regions 201, 202 and gate regions 203, 204. The active regions 201, 202 extend, or are elongated, along an X-X' direction, which is the first direction. The gate regions 203, 204 extend, or are elongated, across the active regions 201, 202 and along a Y-Y' direction, which is the second direction. The Y-Y' direction is transverse to the X-X' direction. In at least one embodiment, the Y-Y' direction is perpendicular to the X-X' direction. Active regions are sometimes referred to as oxide-definition (OD) regions, and are schematically illustrated in the drawings with the label "OD." The X-X' direction is sometimes referred to as the OD direction. The active regions 201, 202 include P-type dopants and/or N-type dopants. The gate regions 203, 204 include a conductive material, such as, polysilicon, and is schematically illustrated in the drawings with the label "PO." The Y-Y' direction is sometimes referred to as the Poly direction. Other conductive materials for the gate regions, such as metals, are within the scope of various embodiments.

The active regions 201, 202 and the gate regions 203, 204 together form one or more circuit elements (not shown). Although in the example configuration in FIG. 2, the active regions 201, 202 and gate regions 203, 204 are shown inside the section 220, this is for illustrative purposes. In some embodiments, active regions and/or gate regions are arranged in other sections of the circuit region 200. In at least one embodiment, active regions and gate regions, and therefore corresponding circuit elements of the circuit region 200, are arranged over substantially an entirety of the circuit region 200 as defined by the boundary 210. The circuit elements of the circuit region 200 are interconnected by nets (not shown) to form internal circuitry of the circuit region 200. The internal circuitry of the circuit region 200 is configured to perform at least one function of the circuit region 200. The nets of the circuit region 200 comprise metal patterns in various metal layers arranged one on top another. For example, the lowermost metal layer immediately over the active regions is sometimes referred to as the metal-zero (M0) layer, the subsequent metal layer immediately over the M0 layer is sometimes referred to as the metal-one (M1) layer, and so on.

The circuit region 200 comprises at least one input/output (IO) pattern configured to electrically couple the circuit region to external circuitry outside the circuit region. In the example configuration in FIG. 2, the circuit region 200 comprises IO patterns 221-229. Each of the IO patterns 221-229 is electrically coupled by one or more nets to one or more circuit elements in the internal circuitry of the circuit region 200. Therefore, when external circuitry is electrically coupled to the IO patterns 221-229, the external circuitry is electrically coupled to the internal circuitry of the circuit region 200 to integrate the circuit region 200 with other circuit regions in the IC device. Examples of IO patterns include, but are not limited to, signal IO patterns configured to communicate data signals to or from the circuit region 200, power IO patterns configured to supply power supply voltages to the circuit region 200, or the like.

In the example configuration in FIG. 2, the IO patterns 221-224, 228-229 are signal IO patterns, whereas IO patterns 225-227 are power IO patterns and are schematically illustrated in the drawings with the label "PG" (power-ground). Power supply voltages carried by the power IO patterns include one or more positive power supply voltages, and the ground voltage. Power IO patterns are wider than signal IO patterns. For example, as illustrated in FIG. 2, the power IO pattern 225 has a width d1 greater than a width d2 of the signal IO pattern 224. Further, power IO patterns are longer than signal IO patterns. For example, as illustrated in FIG. 2, the signal IO patterns 221-224, 228-229 are shorter and arranged each adjacent one corresponding side of the boundary 210. Specifically, the signal IO patterns 221-224 are arranged adjacent the side 214, whereas the signal IO patterns 228-229 are arranged adjacent the side 213 of the boundary 210. In contrast, each of the power IO patterns 225-227 is longer and extends from one side of the boundary 210 to another. Specifically, the power IO pattern 225 extends from the side 214 to the adjacent side 211, whereas the power IO patterns 226-227 extend from the side 213 to the adjacent side 212. The described types, numbers, and/or sizes of the IO patterns are examples. Other configurations are within the scopes of various embodiments.

Each of the IO patterns 221-229 of the circuit region 200 extends, or is elongated, along a direction oblique to both the X-X' direction and the Y-Y' direction. For example, the IO patterns 221-227 are arranged in metal layer M4, and extend along a U-U' direction which is oblique to both the X-X' direction and the Y-Y' direction. Further, the IO patterns 228-229 are arranged in metal layer M3, and extend along a V-V' direction which is oblique to both the X-X' direction and the Y-Y' direction. The U-U' direction is transverse to the V-V' direction. In one or more embodiments, the U-U' direction is perpendicular to the V-V' direction. In at least one embodiment, the U-U' direction is oblique, i.e., not perpendicular, to the V-V' direction.

The U-U' direction of the IO patterns 221-227 in the metal layer M4 forms with either of the X-X' direction or the Y-Y' direction an acute angle. For example, as illustrated in FIG. 2, an angle 230 between the U-U' direction and the Y-Y' direction is an acute angle. The acute angle may be between any one of orientations U, U' and any one of orientations Y, Y'. Similarly, the U-U' direction and the X-X' direction form therebetween an acute angle which may be between any one of orientations U, U' and any one of orientations X, X'. The V-V' direction of the IO patterns 228-229 in the metal layer M3 forms with either of the X-X' direction or the Y-Y' direction an acute angle. For example, the V-V' direction and the X-X' direction form therebetween an acute angle which may be between any one of orientations V, V' and any one of orientations X, X'. Similarly, the U-U' direction and the Y-Y' direction form therebetween an acute angle which may be between any one of orientations U, U' and any one of orientations Y, Y'. Any of the described acute angles, e.g., the angle 230, is greater than 0 degrees, and is smaller than 90 degrees. In some embodiments, the acute angle 230 is between 10 degrees and 80 degrees, or between 20 degrees and 70 degrees, or between 30 degrees and 60 degrees, or between 40 degrees and 50 degrees. In at least one embodiment, the acute angle 230 is 45 degrees. In the example configuration in FIG. 2, the sides 211, 213 of the boundary 210 extend along the X-X' direction, and the sides 212, 214 of the boundary 210 extend along the Y-Y' direction. Accordingly, the IO patterns 221-229 are also oblique to the sides 211-214 of the boundary 210. The oblique directions of the IO patterns 221-229 with respect to the X-X' direction and the Y-Y' direction facilitate integration of the circuit region 200 with other circuit regions, as described herein.

In some embodiments, all metal patterns in the metal layer M4 of an IC device including the circuit region 200, are linear and parallel to the U-U' direction. In other words, metal patterns in the metal layer M4 of the IC device but outside the boundary 210 of the circuit region 200 are linear and parallel to the U-U' direction. In some embodiments, all metal patterns in the metal layer M3 of the IC device including the circuit region 200, are linear and parallel to the V-V' direction. In other words, metal patterns in the metal layer M3 of the IC device but outside the boundary 210 of the circuit region 200 are linear and parallel to the V-V' direction.

In some embodiments, all metal patterns in each metal layer below the metal layers containing the IO patterns extend along the X-X' direction or in the Y-Y' direction. For example, for the metal layers M2, M1, M0 below the metal layer M3, the metal layers M0 and M2 have metal patterns extending along the X-X' direction (sometimes referred to as the "horizontal metal direction"), whereas the metal layer M1 has metal patterns extending along the Y-Y' direction (sometimes referred to as the "vertical metal direction").

In some embodiments, metal patterns in one or more or all metal layers above the metal layers containing the IO patterns extend along the X-X' direction or in the Y-Y' direction. For example, metal patterns in the metal layer M5 extend along the X-X' direction in one or more embodiments, or extend along the Y-Y' direction in one or more further embodiments, as described herein.

In some embodiments, each of the IO patterns 221-229 is completely arranged within the boundary 210 of the circuit region 200.

In some embodiments, the metal layers containing the IO patterns are the topmost metal layers of the circuit region 200. For example, the circuit region 200 is an IP block read from an IP library, and placed by an APR tool into the IC layout diagram of an IC device. The IP block includes no information about layers above the metal layer M4, making the metal layer M3 and the metal layer M4 the two topmost metal layers of the IP block.

The described configurations of the IO patterns 221-229 are examples. Other configurations are within the scopes of various embodiments. For example, in at least one embodiment, IO patterns of the circuit region 200 are arranged in one or more metal layers other than the metal layer M3 and/or the metal layer M4. In one or more embodiments, IO patterns of the circuit region 200 are arranged in non-consecutive metal layers. In at least one embodiment, the IO patterns 221-227 are tilted to the other side of the Y-Y' direction, i.e., the U-U' direction is arranged such that the orientation U is in the quarter between the orientation Y and the orientation X'. In one or more embodiments, IO patterns of the circuit region 200 are arranged in one metal layer. For example, the IO patterns 228-229 are omitted and all IO patterns of the circuit region 200 are arranged in the metal layer M4. In one or more embodiments, IO patterns of the circuit region 200 are arranged in more than two metal layers. For example, IO patterns of the circuit region 200 are arranged in three metal layers M3, M4, M5. In at least one embodiment, the IO patterns in the three metal layers have three different metal directions. For example, metal patterns in the metal layer M5 extend along a direction (not shown) that is oblique to all of the X-X' direction, Y-Y' direction, U-U' direction and V-V' direction.

FIGS. 3A-3D are schematic views showing various routing arrangements for the circuit region 200 in an IC device, in accordance with some embodiments.

In FIG. 3A, an IO pattern is accessed from a metal layer different from the metal layer in which the IO pattern is arranged, in accordance with some embodiments. For example, to access, or electrically couple, to the IO pattern 221, an APR tool generates or routes, in the metal layer M5 over the metal layer M4 in which the IO pattern 221 is arranged, an access pattern 311. The access pattern 311 extends along the X-X' direction from outside the boundary 210 of the circuit region 200 to inside the boundary 210 to overlap the IO pattern 221. The APR tool further generates, in a via layer VIA4 between the metal layer M4 and the metal layer M5, a via 313 electrically coupling the access pattern 311 to the IO pattern 221. Other circuitry electrically coupled to the access pattern 311 is electrically coupled to the IO pattern 221 and, hence, to the internal circuitry of the circuit region 200. Because the access pattern 311 extends along the X-X' direction and the IO pattern 221 extends along the U-U' direction, an angle 315 between the access pattern 311 and the IO pattern 221 is an acute angle. As illustrated in FIG. 3A, the angle 315 is formed between longitudinal center lines of the access pattern 311 and the IO pattern 221.

In some embodiments, another arrangement for accessing an IO pattern is from the same metal layer in which the IO pattern is arrangement. For example, to access, or electrically couple, to the IO pattern 222, the APR tool generates, or routes, in the same metal layer M4 where the IO pattern 222 is arranged, an extension pattern 322. The extension pattern 322 is contiguous to the IO pattern 222 and extends from inside the boundary 210 of the circuit region 200 to outside the boundary 210. In one or more embodiments, the extension pattern 322 is linear and aligned with the IO pattern 222, i.e., a longitudinal center line of the extension pattern 322 coincides with a longitudinal center line of the IO pattern 222. In at least one embodiment, the extension pattern 322 has the same width as the IO pattern 222. The extension pattern 322 extends to overlap a further pattern 324 in the metal layer M3. The further pattern 324 extends along the V-V' direction like the IO patterns 228-229 in the same metal layer M3. The APR tool further generates, in a via layer VIA3 between the metal layer M3 and the metal layer M4, a via 326 electrically coupling the extension pattern 322 to the further pattern 324.

FIG. 3B shows a further routing arrangement for the circuit region 200, in accordance with some embodiments.

A difference between the routing arrangements in FIGS. 3A and 3B is that an access pattern 331 in FIG. 3B corresponds to the access pattern 311 in FIG. 3A, but extends instead along the Y-Y' direction. The routing arrangement in FIG. 3A is applicable when the metal layer M5 has the horizontal metal direction, and the routing arrangement in FIG. 3B is applicable when the metal layer M5 has the vertical metal direction.

A further difference between the routing arrangements in FIGS. 3A and 3B is that the further pattern 324 is an IO pattern of a further circuit region 350, in accordance with some embodiments. The further circuit region 350 is placed by the APR tool to be adjacent to the circuit region 200. In some embodiments, the APR tool places the further circuit region 350 in abutment with the circuit region 200. The APR tool integrates the circuit region 200 and the further circuit region 350 by extending the IO pattern 222 of the circuit region 200 with the extension pattern 322 until the extension pattern 322 overlaps the IO pattern 324 of the further circuit region 350.

FIG. 3C shows a further routing arrangement for the circuit region 200, in accordance with some embodiments.

In FIG. 3C, to access, or electrically couple, to the power IO patterns 225-227, the APR tool generates or routes, in the metal layer M5 over the metal layer M4 in which the power IO patterns 225-227 are arranged, an access pattern 333. The access pattern 333 extends along the X-X' direction, across an entire width of the circuit region 200 to overlap the power IO patterns 225-227. The APR tool further generates, in the via layer VIA4, a plurality of vias 335-337 electrically coupling the access pattern 333 correspondingly to the power IO patterns 225-227. As a result, the internal circuitry of the circuit region 200 is configured to receive power supply through the access pattern 333 and the power IO patterns 225-227.

FIG. 3D shows a further routing arrangement for the circuit region 200, in accordance with some embodiments.

A difference between the routing arrangements in FIGS. 3C and 3D is that an access pattern 343 in FIG. 3D corresponds to the access pattern 333 in FIG. 3C, but extends instead along the Y-Y' direction. The access pattern 343 extends across an entire height of the circuit region 200 in the Y-Y' direction to overlap the power IO patterns 225-227, and is electrically coupled to the power IO patterns 225-227 correspondingly by vias 345-347. The routing arrangement in FIG. 3C is applicable when the metal layer M5 has the horizontal metal direction, and the routing arrangement in FIG. 3D is applicable when the metal layer M5 has the vertical metal direction. In at least one embodiment, the routing arrangements in FIGS. 3A and 3C are usable together, whereas the routing arrangements in FIGS. 3B and 3D are usable together.

The described routing arrangements are examples. Other routing arrangements are within the scopes of various embodiments. For example, in one or more embodiments, at least one of the access patterns 311, 331, 333, 343 is arranged in a metal layer other than the metal layer M5, or in a metal layer not immediately adjacent to the metal layer of the IO pattern to be accessed.

In some embodiments, an APR tool has at least two options for accessing an IO pattern. For example, as described with respect to FIG. 3A, a first option is to access the IO pattern 221 by the access pattern 311 from an adjacent metal layer, e.g., the metal layer M5. A second option is to access the IO pattern 221 by an extension pattern on the same metal layer, e.g., the metal layer M4, in a manner similar to that described with respect to the IO pattern 222. In at least one embodiment, multiple options for accessing an IO pattern provide routing flexibility and/or make it easier to integrate the circuit region 200 with other circuit regions in the IC device. One or more of these advantages are not observable or are difficult to achieve in other approaches that do not include oblique IO patterns.

In some embodiments, regardless of the metal direction in a metal layer of the IC device that is to be used for integrating circuit regions, there is always an available option for the APR tool to perform integration. For example, in one or more embodiments where the metal layer (e.g., the metal layer M5) to be used for integration of circuit regions has the horizontal metal direction, the APR tool is configured to apply the routing arrangements described with respect to FIGS. 3A and 3C. In one or more embodiments where the metal layer (e.g., the metal layer M5) to be used for integration of circuit regions has the vertical metal direction, the APR tool is configured to apply the routing arrangements described with respect to FIGS. 3B and 3D. As a result, it is possible in at least one embodiment to use a circuit region, e.g., an IP block, with different metal schemes without having to revise the layout of the IP block to be compatible with a specific metal scheme the IP block is to be used with. It is also possible in one or more embodiments to integrate circuit regions with different built-in metal schemes. One or more of these advantages are not observable or are difficult to achieve in other approaches that do not include oblique IO patterns.

In some embodiments, integration of adjacently placed circuit regions is possible simply by extending an IO pattern of one circuit region by an extension pattern until the extension pattern overlaps a corresponding IO pattern of another circuit region, and then arranging a via at the overlapping section to electrically couple the corresponding IO patterns. For example, as described with respect to FIG. 3B, by simply extending the IO pattern 222 of the circuit region 200 by an extension pattern 322 until the extension pattern 322 overlaps a corresponding IO pattern 324 of another circuit region 350, and then arranging a via 326 at the overlapping section, it is possible to electrically couple the corresponding IO patterns 222 and 324 and, hence, integrate the circuit region 200 and the further circuit region 350. As a result, in at least one embodiment, it is easier to integrate circuit regions than in other approaches that do not include oblique IO patterns.

Figure 3E:
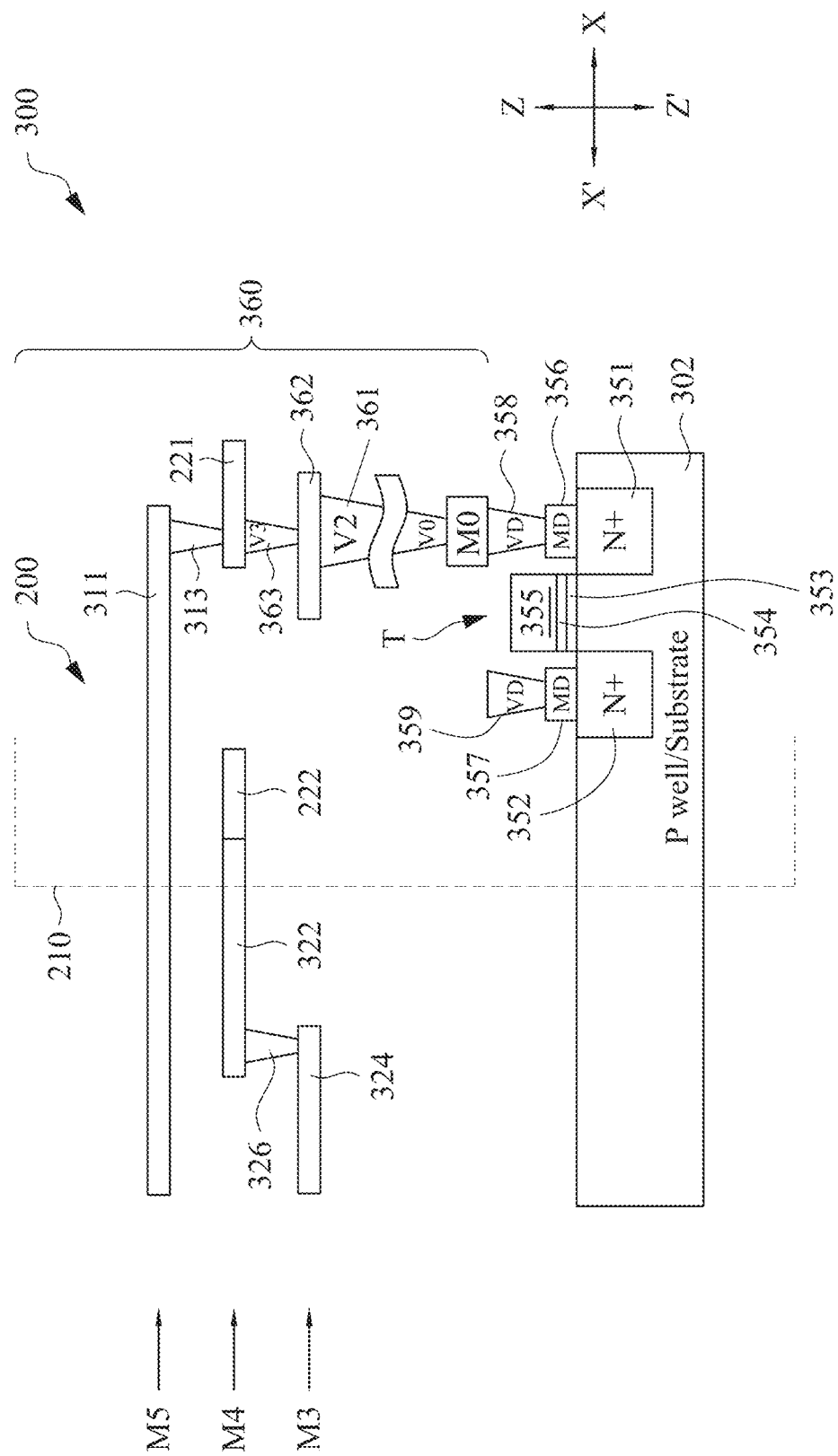
FIG. 3E is a schematic cross-sectional view, taken along line E1-E2-E3-E4 in FIG. 3A, of an IC device in accordance with some embodiments.

FIG. 3E is a schematic cross-sectional view, taken along line E1-E2-E3-E4 in FIG. 3A, of an IC device 300 in accordance with some embodiments. The IC device 300 comprises a circuit region corresponding to the circuit region 200 described with respect to FIG. 3A. The cross-section line E1-E2 in FIG. 3A extends along the longitudinal center line of the access pattern 311, and then along the longitudinal center line of the IO pattern 221. The cross-section line E3-E4 in FIG. 3A extends along the longitudinal center line of the IO pattern 222 and the extension pattern 322, and then along the longitudinal center line of the further pattern 324. Corresponding components in FIG. 3A and FIG. 3E are indicated by the same reference numerals. In at least one embodiment, the IC device 300 corresponds to the IC device 100.

As shown in FIG. 3E, the IC device 300 comprises a substrate 302 over which the circuit region 200 is formed. In at least one embodiment, the substrate 302 corresponds to the substrate 102. N-type and P-type dopants are added to the substrate 302 to correspondingly form N wells 351, 352, and P wells (not shown). In some embodiments, isolation structures are formed between adjacent P wells and N wells. For simplicity, several features such as P wells and isolation structures are omitted from FIG. 3E. In at least one embodiment, the N wells 351, 352 correspond to the active region 201, 202. The N wells 351, 352 define source/drain regions of a transistor T. The N wells 351, 352 are referred to herein as source/drain regions 351, 352. A gate region of the transistor T comprises a stack of gate dielectric layers 353, 354, and a gate electrode 355. In at least one embodiment, the transistor T comprises a gate dielectric layer instead of multiple gate dielectrics. Example materials of the gate dielectric layer or layers include $HfO_2$, $ZrO_2$, or the like. Example materials of the gate electrode 355 include poly-silicon, metal, or the like. In at least one embodiment, the gate electrode 355 of the transistor T corresponds to the gate region 203, 204. The transistor T is an example of a circuit element in the internal circuitry of the circuit region 200. Contact structures for electrically coupling the transistor T to other circuit elements in the circuitry of the IC device 300 comprise metal-to-device (MD) regions 356, 357 correspondingly over and in electrical contact with the source/drain regions 351, 352, and a via structure (not shown) over and in electrical contact with the gate electrode 355. Further via-to-device (VD) via structures 358, 359 are correspondingly over and in electrical contact with the MD regions 356, 357. An interconnect structure 360 is over the VD via structures 358, 359, and comprises a plurality of metal layers M0, M1, . . . and a plurality of via layers V0, V1, . . . arranged alternatingly in a thickness direction of the substrate 302, i.e., along a Z-Z' direction. The interconnect structure 360 further comprises various interlayer dielectric (ILD) layers (not shown) in which the metal layers and via layers are embedded. The metal layers and via layers of the interconnect structure 360 are configured to electrically couple various elements or circuits of the IC device 300 with each other, and with external circuitry.

In the example configuration in FIG. 3E, the source/drain region 351 of the transistor T is electrically coupled to the IO pattern 221 in the metal layer M4 through a via 361 in a via layer V2, a conductive pattern 362 in the metal layer M3, and a via 363 in a via layer V3. The access pattern 311 in the metal layer M5 extends along the X-X' direction from outside the boundary 210 of the circuit region 200 to inside the boundary 210 to overlap the IO pattern 221. The IO pattern 221 is electrically coupled to the access pattern 311 through the via 313, as described with respect to FIG. 3A.

The IO pattern 222 is electrically coupled to the internal circuitry of the circuit region 200 through one or more vias and/or conductive patterns in corresponding metal layers. For simplicity, the one or more vias and/or conductive patterns electrically coupled to the IO pattern 222 are omitted in FIG. 3E. Further, although the IO patterns 221, 222 have about the same position along the X-X' direction in FIG. 3A, the IO patterns 221, 222 in FIG. 3E are shifted along the X-X' direction for illustrative purposes. The extension pattern 322 is contiguous to the IO pattern 222 and extends from inside the boundary 210 of the circuit region 200 to outside the boundary 210. The extension pattern 322 overlaps the further pattern 324 in the metal layer M3, and is electrically coupled by the via 326 to the further pattern 324, as described with respect to FIG. 3A. Other configurations are within the scopes of various embodiments.

FIG. 4A is a schematic view of a core 400, in accordance with some embodiments. In at least one embodiment, the core 400 comprises a circuit region, or a combination of circuit regions, over a substrate as described with respect to FIG. 1. In at least one embodiment, the core 400 comprises an IP core. In at least one embodiment, the core 400 comprises a whole individual IC device.

The core 400 comprises a core region 410 and a ring region 412 over the substrate (not shown), and at least one IO pattern arranged in the ring region 412 and configured to electrically couple the core region 410 to external circuitry outside the core 400.

The core region 410 comprises at least one active region extending along the X-X' direction, and at least one gate region extending across the at least one active region and along the Y-Y' direction, as described with respect to FIG. 1. In at least one embodiment, the core region 410 comprises various active regions and gate regions coupled into one or more logics which configure internal circuitry of the core region 410 to perform intended functions of the core 400.

The ring region 412 extends around, or surrounds, the core region 410. In at least one embodiment, the ring region 412 is free of logics, and comprises various nets that electrically couple the internal circuitry of the core region 410 to the at least one IO pattern. In at least one embodiment, in addition to the various nets that electrically couple the internal circuitry of the core region 410 to the at least one IO pattern, the ring region 412 further comprises IO circuits configured for data input/output, but not for data processing. For example, some IO circuits are configured to change signal voltages to levels suitable for the external circuitry and/or the internal circuitry of the core region 410.

In the example configuration in FIG. 4A, the at least one IO pattern arranged in the ring region 412 comprises a plurality of first IO patterns 413, 414 in a first metal layer Mj and a plurality of second IO patterns 415, 416 in a second metal layer Mi, where i and j are natural numbers, and i<j corresponding to the metal layer Mj being higher or above the metal layer Mi. In at least one embodiment, the metal layer Mj and the metal layer Mi are consecutive metal layers, i.e., the metal layer Mj is immediately above the metal layer Mi. In at least one embodiment, the metal layer Mj and the metal layer Mi are not consecutive metal layers, i.e., the metal layer Mj is higher than the metal layer Mi with at least one further metal layer in between. In at least one embodiment, the metal layer Mj and the metal layer Mi are topmost metal layers of the core 400. An IC device comprising the core 400 comprises higher metal layers over the topmost metal layers of the core 400 for integrating the core 400 with other circuit regions of the IC device.

The first IO patterns 413, 414 extend in the U-U' direction that is oblique to both the X-X' direction and the Y-Y' direction. The second IO patterns 415, 416 extend in the V-V' direction that is also oblique to both the X-X' direction and the Y-Y' direction. The first IO patterns 413, 414 and second IO patterns 415, 416 are electrically coupled to the core region 410 by various nets (not shown). The core region 410, first IO patterns 413, 414, and second IO patterns 415, 416 are all arranged within a boundary 422 of the ring region 412. The boundary 422 comprises sides 423-426, among which sides 424, 426 extend along the X-X' direction, and sides 423, 425 extend along the Y-Y' direction. In at least one embodiment, the boundary 422 is a virtual periphery of the core 400 where the core 400 is arranged together with one or more other circuit regions over a substrate to form an IC device. In at least one embodiment, the boundary 422 is a physical periphery or edge of the core 400 where the core 400 is the whole IC device itself.

Each of the first IO patterns 413, 414 and the second IO patterns 415, 416 extends toward a corresponding adjacent side of the boundary 422 at an acute angle. In the example configuration in FIG. 4A, the first IO patterns 413 extend from the core region 410 outwardly toward the adjacent side 423 at an acute angle, the first IO patterns 414 extend from the core region 410 outwardly toward the adjacent side 424 at an acute angle, the second IO patterns 415 extend from the core region 410 outwardly toward the adjacent side 425 at an acute angle, and the second IO patterns 416 extend from the core region 410 outwardly toward the adjacent side 426 at an acute angle.

The described configuration of the core 400 is an example. Other configurations are within the scopes of various embodiments. For example, in at least one embodiment, all IO patterns of the core 400 are arranged in one metal layer, or the IO patterns of the core 400 are arranged in more than two metal layers. In some embodiments where the IO patterns of the core 400 are arranged in three or more metal layers, the IO patterns have correspondingly three or more different metal directions. In at least one embodiment, IO patterns are not necessarily arranged along all sides of the ring region 412.

In one or more embodiments, one or more of the routing arrangements described with respect to FIGS. 3A-3D is/are applicable to route metal patterns to electrically couple to the IO patterns 413-416 for accessing internal circuitry of the core region 410. In at least one embodiment, one or more advantages described with respect to FIGS. 2 and 3A-3D is/are achievable with the core 400.

FIG. 4B is a schematic view of a core 430, in accordance with some embodiments. In at least one embodiment, the core 430 comprises a circuit region, or a combination of circuit regions, over a substrate as described with respect to FIG. 1. In at least one embodiment, the core 430 comprises an IP core. In at least one embodiment, the core 430 comprises a whole individual IC device.

A difference between the core 400 and the core 430 is that, in the core 400, there is one layer of IO patterns along each side of the ring region 412, whereas in the core 430, there are two layers of IO patterns along each side of the ring region 412. Compared to the core 400, the core 430 additionally comprises first IO patterns 435, 436 and second IO patterns 433, 434. The first IO patterns 435, 436 are arranged in the metal layer Mj, and the second IO patterns 433, 434 are arranged in the metal layer Mi. The second IO patterns 433 are arranged along the side 423 of the ring region 412, overlap and are electrically coupled to the corresponding first IO patterns 413 by vias 443. The second IO patterns 434 are arranged along the side 424 of the ring region 412, overlap and are electrically coupled to the corresponding first IO patterns 414 by vias 444. The first IO patterns 435 are arranged along the side 425 of the ring region 412, overlap and are electrically coupled to the corresponding second IO patterns 415 by vias 445. The first IO patterns 436 are arranged along the side 426 of the ring region 412, overlap and are electrically coupled to the corresponding second IO patterns 416 by vias 446. The vias 443-446 are in a via layer VIAi between the metal layer Mj and the metal layer Mi.

In one or more embodiments, one or more of the routing arrangements described with respect to FIGS. 3A-3D is/are applicable to route metal patterns to electrically couple to the IO patterns 413-416, 433-436 for accessing internal circuitry of the core region 410 in the core 430. In at least one embodiment, one or more advantages described with respect to FIGS. 2 and 3A-3D is/are achievable with the core 430. By arranging multiple layers of IO patterns along at least one side of the ring region 412 in accordance with some embodiments, there are more choices for accessing the IO patterns resulting in routing flexibility and/or making it easier to integrate the core 430 with other circuit regions in the IC device.

FIGS. 5A-5E are schematic views showing various arrangements for integrating cores, in accordance with some embodiments.

Figure 5A:
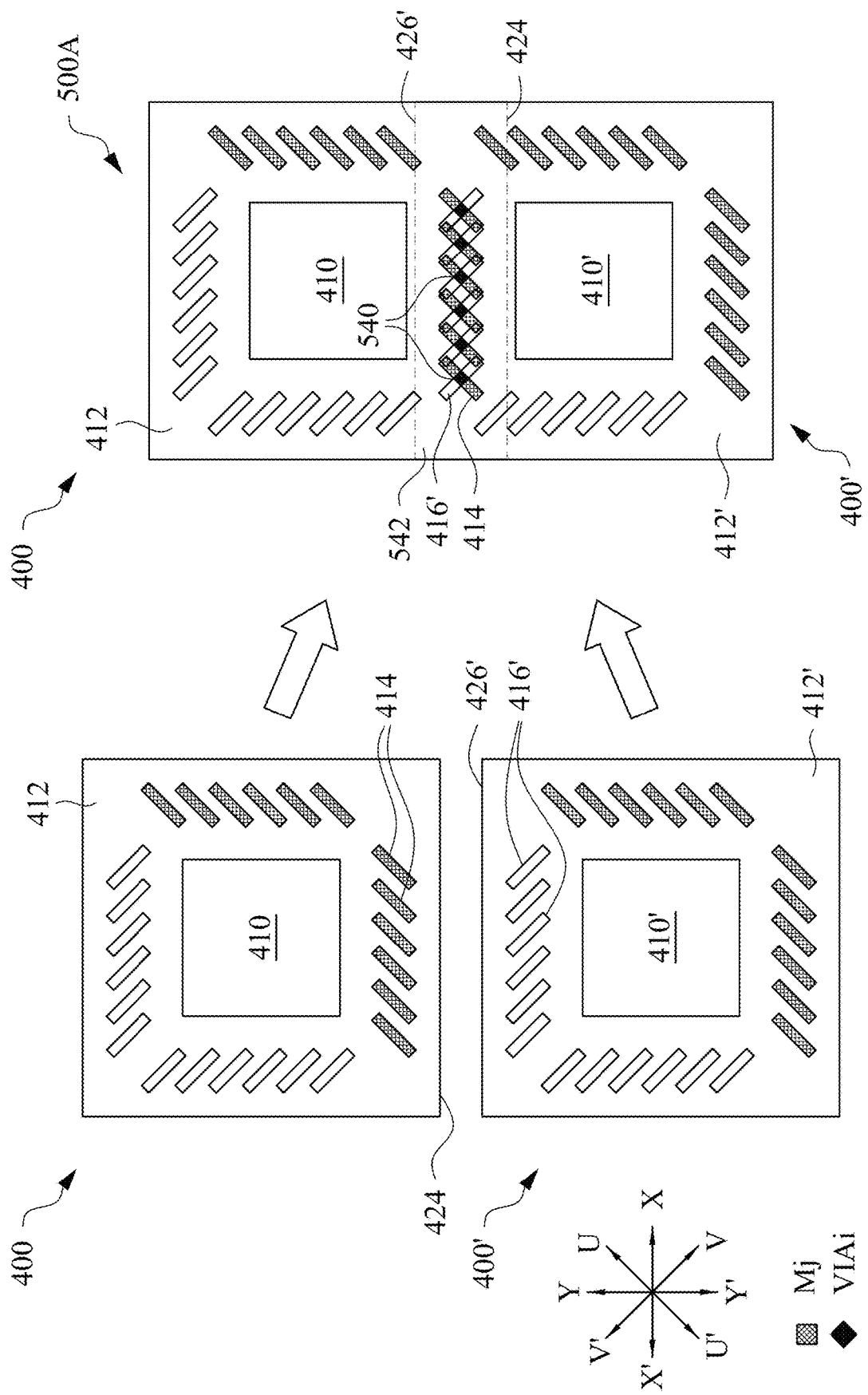
FIGS. 5A-5E are schematic views showing various arrangements for integrating cores, in accordance with some embodiments.

In FIG. 5A, the core 400 and a core 400' are integrated in an overlapping manner into an integrated core 500A, in accordance with some embodiments. In the example configuration in FIG. 5A, the core 400' includes components corresponding to those of the core 400. For simplicity, a component of the core 400' is indicated in the drawings by the same reference numeral of the corresponding component in the core 400 but with the prime symbol. In at least one embodiment, an APR tool is configured to integrate the core 400 and core 400' by placing the core 400 and core 400' so that the ring region 412 of the core 400 and the corresponding ring region 412' of the core 400' partially overlap each other in the Y-Y' direction at an overlapped section 542. The overlapped section 542 is defined between the side 426' of the core 400' and the side 424 of the core 400 after the overlapping placement of the cores 400, 400'. In the overlapped section 542, the first IO patterns 414 of the core 400 are in the metal layer Mj and overlap the second IO patterns 416' of the core 400' which are in the metal layer Mi. The APR tool is configured to generate vias 540 in the via layer VIAi to electrically couple the corresponding and overlapping IO patterns 414, 416'. In at least one embodiment, the overlapping placement of the cores 400, 400' makes it possible to quickly and easily integrate the cores 400, 400' without using metal patterns in an additional metal layer. Further, the chip area occupied by the integrated core 500A is advantageously reduced compared to a sum of the wafer areas occupied by the cores 400, 400' individually.

Figure 5B:
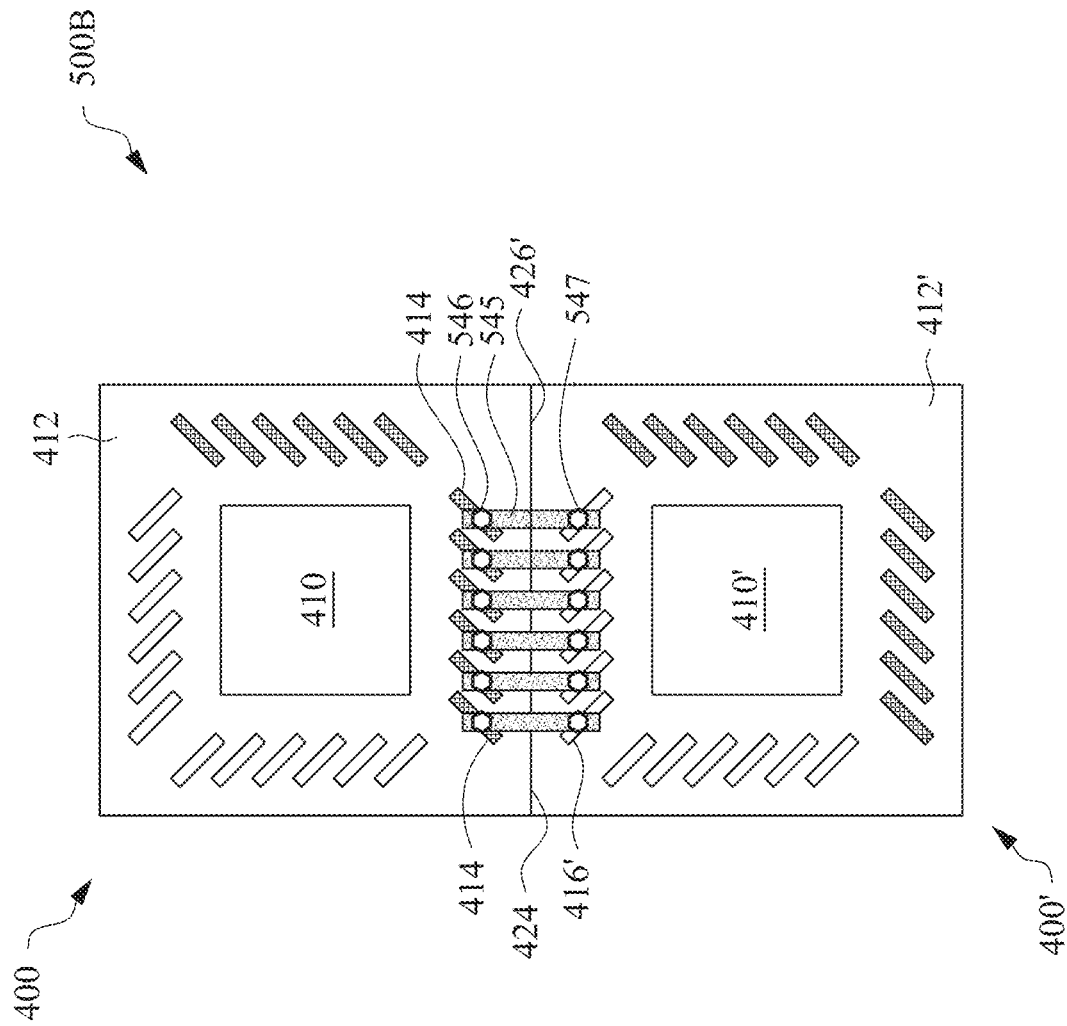

In FIG. 5B, the core 400 and the core 400' are integrated in an abutment manner into an integrated core 500B, in accordance with some embodiments. A difference from the arrangement in FIG. 5A is that, in FIG. 5B, the APR tool places the cores 400, 400' not in an overlapping manner, but in abutment. For example, the side 424 of the core 400 is placed by the APR tool to abut the side 426' of the core 400'. The first IO patterns 414 of the core 400 and the second IO patterns 416' of the core 400' do not overlap, and are electrically coupled by corresponding access patterns 545 in a metal layer Mk and vias 546, 547 in a via layer VIAj between the metal layer Mk and the metal layer Mj, where k is a natural number, and j<k corresponding to the metal layer Mk being higher or above the metal layer Mj. For simplicity, one access pattern 545, one via 546, and one via 547 are indicated in FIG. 5B for one pair of corresponding IO patterns 414, 416'. The electrically coupling between each access pattern 545 and the corresponding IO patterns 414, 416' is similar to the IO pattern access described with respect to FIG. 3B. In at least one embodiment, one or more advantages described herein is/are achievable with the integrated core 500B.

The arrangements described with respect to FIGS. 5A, 5B are examples of vertical core integration in which the cores 400, 400' are integrated in the Y-Y' direction. Other configurations are within the scopes of various embodiments. For example, in at least one embodiment, core integration includes extending an IO pattern of one of the cores 400, 400', by an extension pattern, to extend into the ring region of the other core to a position where the extension pattern overlaps, and is electrically coupled by a via to, a corresponding IO pattern of the other core, as described with respect to FIGS. 3A-3B. Other types of core integration, i.e., horizontal, diagonal, and three-dimensional core integration, are described herein.

Figure 5C:
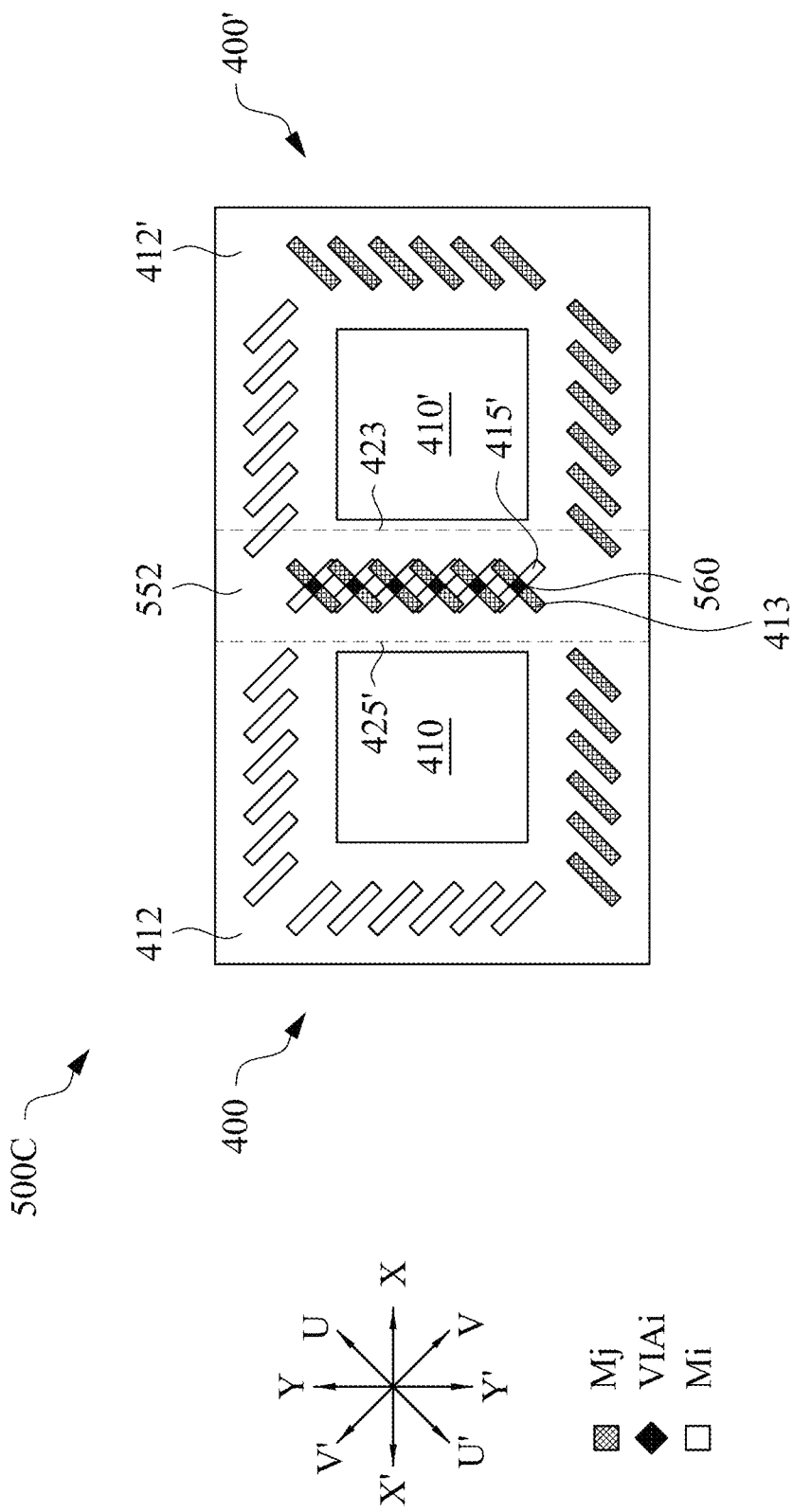

In FIG. 5C, the core 400 and the core 400' are integrated in an overlapping manner into an integrated core 500C, in accordance with some embodiments. A difference from the vertical core integration in FIG. 5A is that, in FIG. 5C, the core integration is horizontal, i.e., in the X-X' direction. In at least one embodiment, an APR tool is configured to integrate the core 400 and core 400' by placing the core 400 and core 400' so that the ring region 412 of the core 400 and the corresponding ring region 412' of the core 400' partially overlap each other in the X-X' direction at an overlapped section 552. The overlapped section 552 is defined between the side 425' of the core 400' and the side 423 of the core 400 after the overlapping placement of the cores 400, 400'. In the overlapped section 552, the first IO patterns 413 of the core 400 are in the metal layer Mj and overlap the second IO patterns 415' of the core 400' which are in the metal layer Mi. The APR tool is configured to generate vias 560 in the via layer VIAi to electrically couple the corresponding and overlapping IO patterns 413, 415'. In at least one embodiment, one or more advantages described with respect to FIG. 5A is/are achievable with the integrated core 500C. In at least one embodiment, the cores 400, 400' are placed in abutment in the X-X' direction, and are integrated using horizontal access patterns in an additional metal layer in a manner similar to that described with respect to FIG. 5B.

Figure 5D:
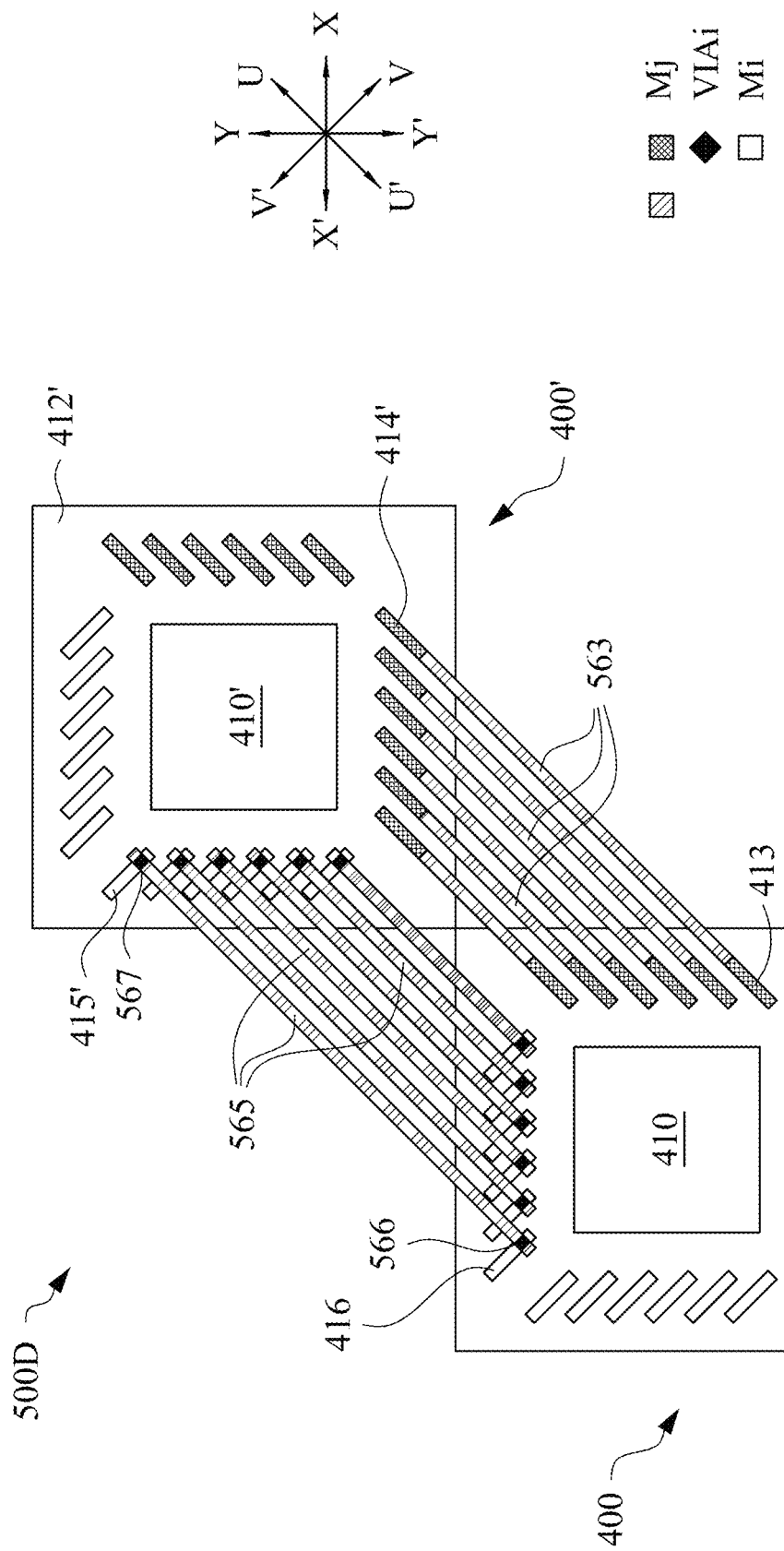

In FIG. 5D, the core 400 and the core 400' are integrated in a diagonal core integration into an integrated core 500D, in accordance with some embodiments. An APR tool is configured to place the cores 400, 400' such that the first IO patterns 413 of the core 400 and the corresponding first IO patterns 414' of the core 400', which are in the same metal layer Mj, are aligned with each other. In at least one embodiment, this alignment is possible where the core 400 and the core 400' include the same metal scheme for the metal layer Mj, i.e., the same metal direction and the same pitch between adjacent metal patterns. A first IO patterns 413 of the core 400 and a corresponding first IO pattern 414' of the core 400' are aligned when their longitudinal center lines coincide. In the example configuration in FIG. 5D, the alignment of the first IO patterns 413 and the corresponding first IO patterns 414' is achieved with the ring region 412 of the core 400 and the ring region 412' of the core 400' touch each other at a corner. Other arrangements are within the scopes of various embodiments. The APR tool generates one or more extension patterns 563 each extending along the same U-U' direction as a corresponding pair of one first IO pattern 413 and one first IO pattern 414', contiguous to both the corresponding first IO pattern 413 and first IO pattern 414', to electrically couple the core region 410 to the core region 410'. The APR tool is further configured to generate, in the metal layer Mj, one or more access patterns 565 each overlapping a corresponding pair of one second IO pattern 416 of the core 400 and one second IO pattern 415' of the core 400', which are in a different metal layer Mi. Each access pattern 565 is electrically coupled to the corresponding overlapped second IO pattern 416 and second IO pattern 415' at vias 566, 567 in the via layer VIAi. In FIG. 5D, for illustrative purposes, the extension patterns 563 and the access patterns 565 are illustrated differently from the first IO patterns 413, 414' even though they are all arranged in the same metal layer Mj. In at least one embodiment, one or more advantages described herein is/are achievable with the integrated core 500D.

Figure 5E:
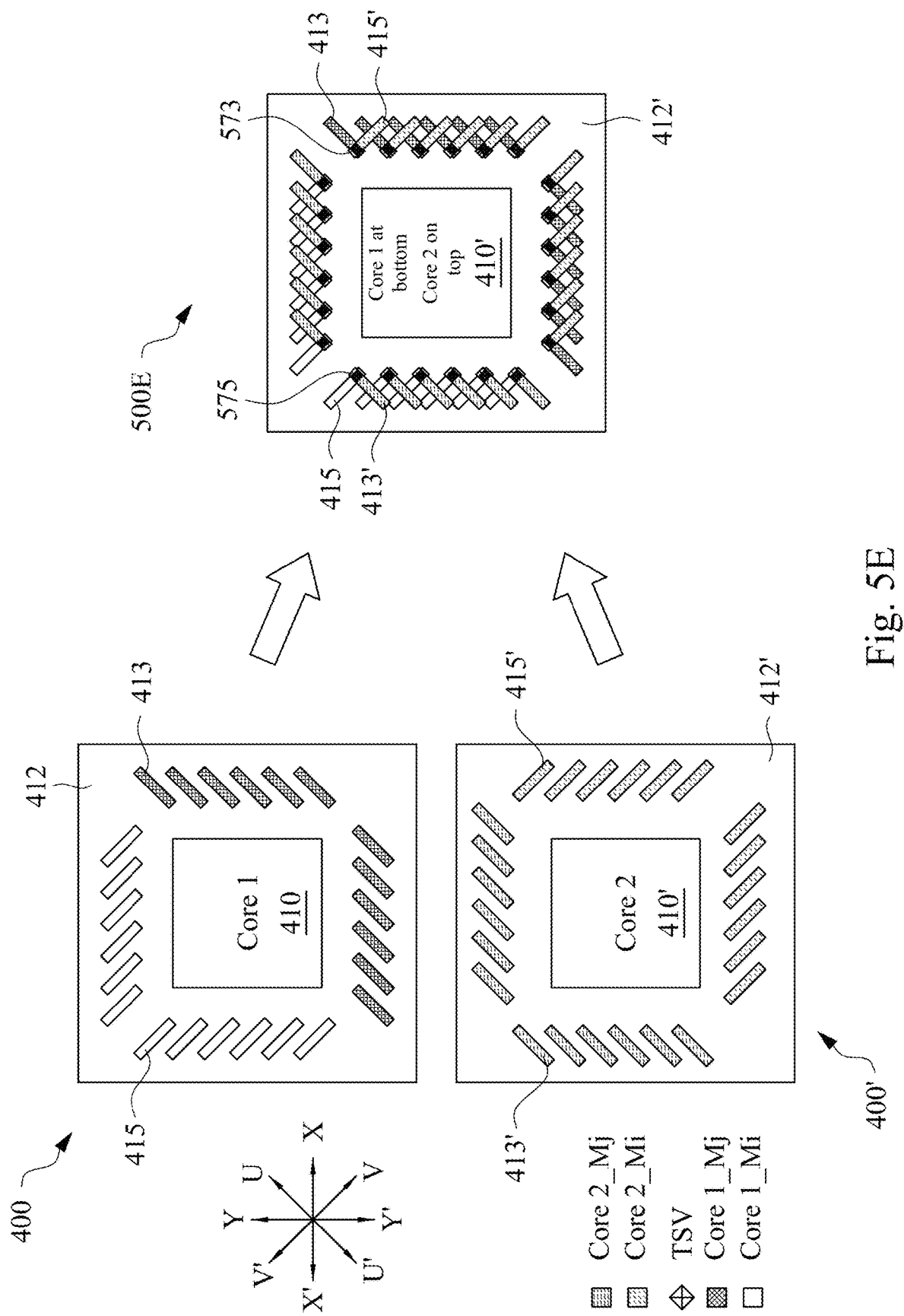

In FIG. 5E, the core 400 and the core 400' are integrated in a three dimensional core integration into an integrated core 500E, in accordance with some embodiments. The core 400' is rotated 180 degrees compared to the core 400' in the other drawings. For illustrative purposes, in FIG. 5E, the core region 410 is referred to as Core 1, the core region 410' is referred to as Core 2, and the IO patterns of the core 400' are illustrated differently from the other drawings. The metal layers Mj, Mi corresponding to each of Core 1, Core 2 are indicated with additional labels "Core 1_," "Core 2_" in FIG. 5E. When the cores 400, 400' are three dimensionally integrated, the core 400 is arranged at the bottom and the core 400' is stacked on top of the core 400. The stacking of the core 400' on top of the core 400 results in the IO patterns of the core 400' overlapping the IO patterns of the core 400. For example, the second IO patterns 415' of the core 400' which, in the other arrangements described with respect to FIGS. 5A-5D, are arranged at a metal layer below the first IO patterns 413 of the core 400 are now on top of the first IO patterns 413. The overlapping second IO patterns 415' and first IO patterns 413 are electrically coupled by through substrate vias (TSVs) 573. For another example, the first IO patterns 413' of the core 400' overlap the second IO patterns 415 of the core 400, and are electrically coupled thereto by TSVs 575. In at least one embodiment, the described three dimensional core integration is performed by an APR tool which generates an IC layout diagram for the integrated core 500E based on which one or more physical IC devices are manufactured. In at least one embodiment, one or more advantages described herein is/are achievable with the integrated core 500E. Further, the chip area is saved compared to when the cores 400, 400' are arranged side-by-side or with partial overlapping, resulting in denser floorplan.

Figure 6:
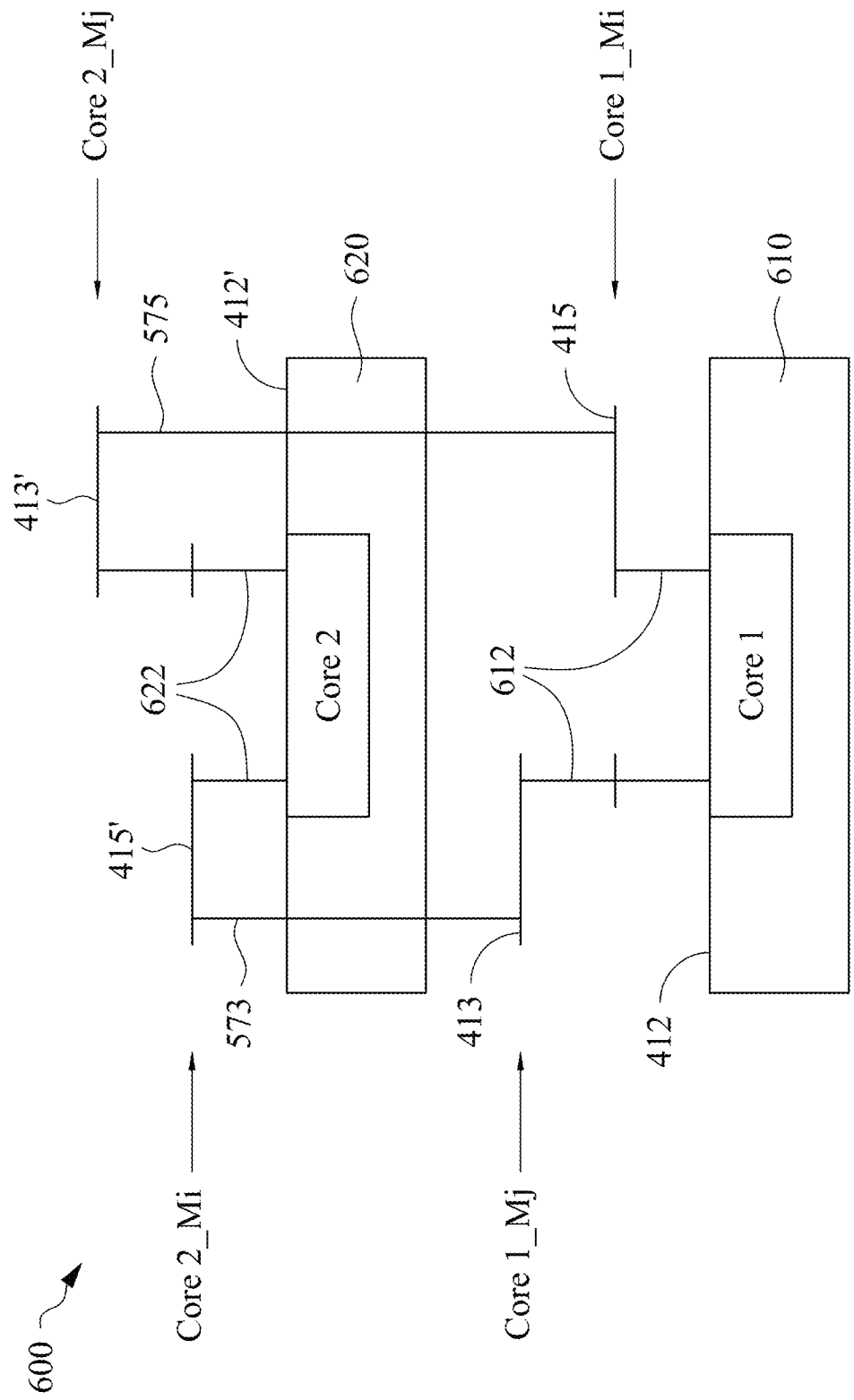
FIG. 6 is a schematic sectional view of a three-dimensional (3D) IC device, in accordance with some embodiments.

FIG. 6 is a schematic sectional view of a 3D IC device 600, in accordance with some embodiments. In at least one embodiment, the 3D IC device 600 corresponds to the integrated core 500E described with respect to FIG. 5E.

The 3D IC device 600 comprises a substrate 610 over which Core 1 is formed. In at least one embodiment, the substrate 610 corresponds to the semiconductor substrate 102 and Core 2 comprises logics. The 3D IC device 600 further comprises a metallization layer 612, which includes one or more metal layers starting from the M0 layer and one or more via layers, and which is formed over Core 1 to electrically couple Core 1 to various corresponding IO patterns, for example, a first IO patterns 413 and a second IO pattern 415 as schematically illustrated in FIG. 6. The first IO patterns 413 and a second IO pattern 415 are arranged in the ring region 412. The 3D IC device 600 further comprises a substrate 620 over which Core 2 is formed. In at least one embodiment, the substrate 620 corresponds to the semiconductor substrate 102, for example, when Core 2 comprises logics and the 3D IC device 600 comprises a logic-on-logic 3D IC structure. In one or more embodiments, the substrate 620 comprises an insulation layer, for example, when Core 2 comprises a metal-insulator-metal (MIM) capacitor arrays. The 3D IC device 600 further comprises a metallization layer 622, which includes one or more metal layers and one or more via layers, and which is formed over Core 2 to electrically couple Core 2 to various corresponding IO patterns, for example, a first IO patterns 413' and a second IO pattern 415' as schematically illustrated in FIG. 6. The first IO patterns 413' and a second IO pattern 415' are arranged in the ring region 412'. The 3D IC device 600 further comprises TSVs 573, 575 extending through the substrate 620 to electrically couple the corresponding IO patterns of Core 1 and Core 2, as described with respect to FIG. 5E. In at least one embodiment, one or more advantages described herein is/are achievable with the 3D IC device 600.

Figure 7A:
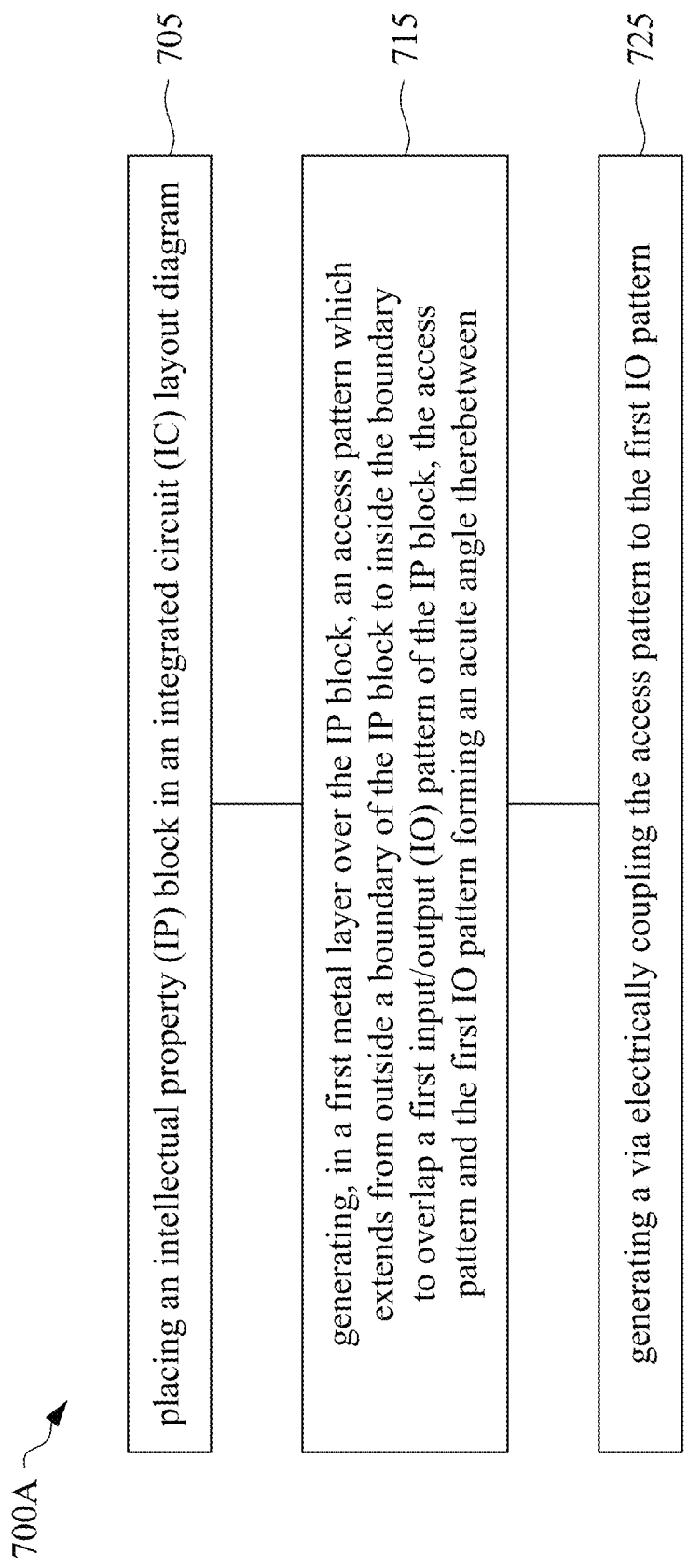
FIG. 7A is a flow chart of a method, in accordance with some embodiments.

FIG. 7A is a flow chart of a method 700A, in accordance with some embodiments. In at least one embodiment, method 700A is performed in whole or in part by a processor as described herein. In at least one embodiment, the method 700A is a method for accessing an IO pattern of an IP block in an IC layout diagram.

At operation 705, an intellectual property (IP) block is placed in an integrated circuit (IC) layout diagram. For example, as described with respect to FIGS. 3A, 3B, a circuit region 200, which in one or more embodiments comprises an IP block, is placed by an APR tool into an IC layout diagram, in a placement operation.

At operation 715, an access pattern is generated in a first metal layer over the IP block. The access pattern extends from outside a boundary of the IP block to inside the boundary to overlap a first input/output (IO) pattern among a plurality of IO patterns of the IP block. For example, as described with respect to FIGS. 3A, 3B, an access pattern 311 or 331 is generated by the APR tool in a routing operation. The access pattern 311 or 331 is in a metal layer, e.g., the metal layer M5, over the IP block which has the metal layer M4 as the topmost metal layer. The access pattern 311 or 331 extends from outside a boundary 210 of the IP block to inside the boundary 210 to overlap a first input/output (IO) pattern 221 among a plurality of IO patterns 221-229 of the IP block. The access pattern 311, 331 and the first IO pattern 221 form an acute angle therebetween, as described and/or illustrated in FIGS. 3A-3B.

At operation 725, a via is generated to electrically couple the overlapping access pattern and first IO pattern. For example, the APR tool generates a via 313 to electrically couple the access pattern 311, 331 to the first IO pattern 221. As a result the IO pattern 221 is electrically couplable, through the access pattern 311, 331, to external circuitry outside the IP block. In at least one embodiment, all operations 705, 715, 725 are automatically performed without user input or intervention.

Figure 7B:
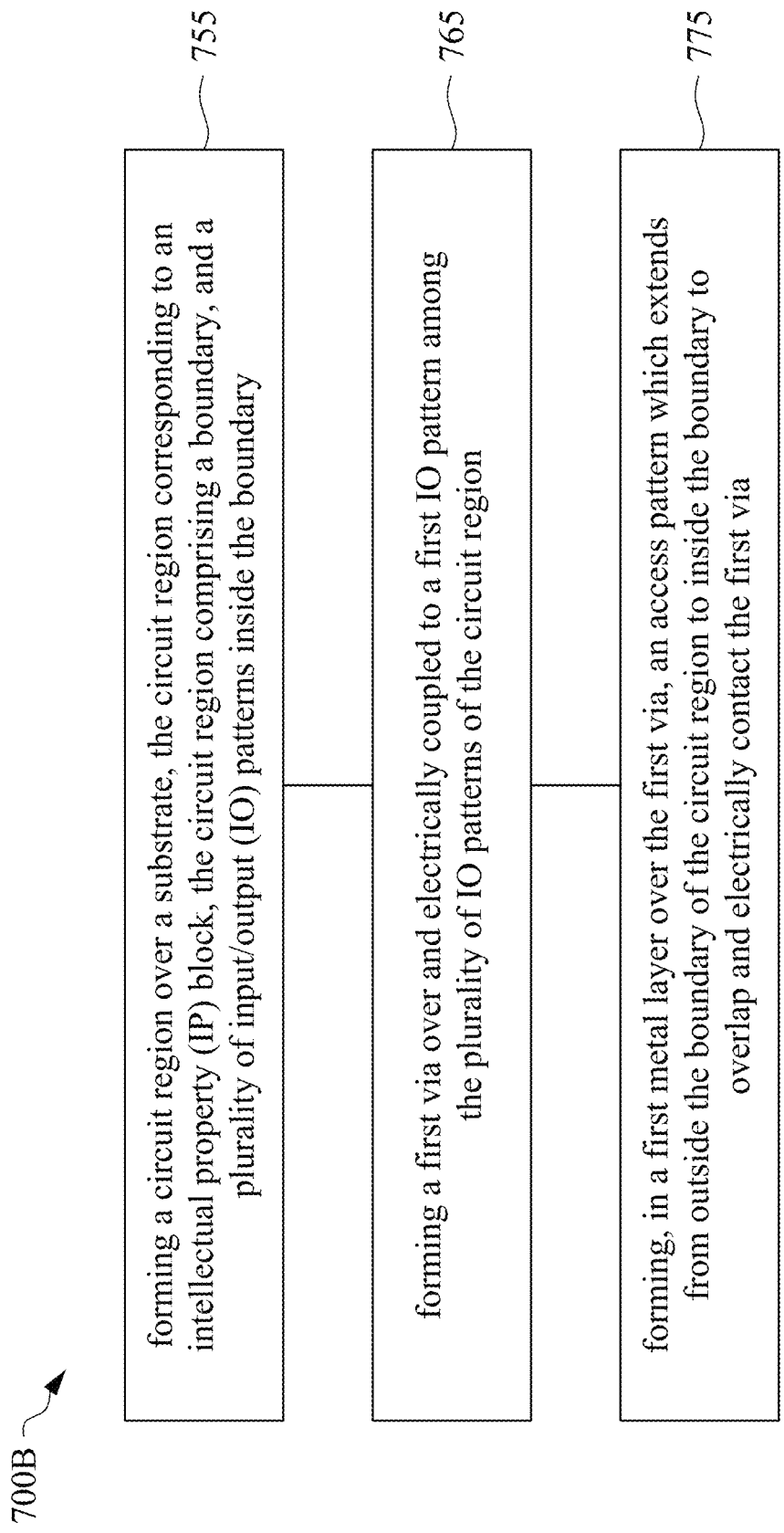
FIG. 7B is a flow chart of a method, in accordance with some embodiments.

FIG. 7B is a flow chart of a method 700B, in accordance with some embodiments. In at least one embodiment, the method 700B is a method of manufacturing an IC device corresponding to an IC layout diagram in which an IO pattern of an IP block is accessed as described with respect to FIG. 7A.

At operation 755, a circuit region is formed over a substrate, the circuit region corresponding to an intellectual property (IP) block. The circuit region comprises a boundary, and a plurality of input/output (IO) patterns inside the boundary. For example, as described with respect to FIG. 3E, a circuit region 200 (with a representative transistor T) is formed over a substrate 302. The circuit region 200 corresponds to an IP block in one or more embodiments, as described herein. Further, as described with respect to FIG. 2, the circuit region comprises a boundary 210, and a plurality of IO patterns 221-227 inside the boundary 210.

At operation 765, a first via is formed over and electrically coupled to a first IO pattern among the plurality of IO patterns of the circuit region. For example, as described with respect to FIG. 3E, a via 313 is formed over and electrically coupled to a first IO pattern 221.

At operation 775, in a first metal layer over the first via, an access pattern is formed to extend from outside the boundary of the circuit region to inside the boundary to overlap and electrically contact the first via, and the access pattern and the first IO pattern form an acute angle therebetween. For example, as described with respect to FIG. 3E, in a metal layer M5 over the first via 313, an access pattern 311 is formed to extend from outside the boundary 210 of the circuit region 200 to inside the boundary 210 to overlap and electrically contact the first via 313 which electrically couples the access pattern 311 to the first IO pattern 221 of the circuit region 200. As described with respect to FIG. 3A the access pattern 311 and the first IO pattern 221 form an acute angle therebetween.

In some embodiments, as described with respect to FIG. 3E, before forming the first via 313, a further pattern 324 is formed in a second metal layer, e.g., the metal layer M3, over the substrate 302. The further pattern 324 is outside the boundary 210 of the circuit region 200. A second via 326 is formed over and electrically coupled to the further pattern 324. In a third metal layer, e.g., the metal layer M4, over the second via 326, the plurality of IO patterns 221-227 are formed and an extension pattern 322 is also formed. The extension pattern 322 is contiguous to a second IO pattern 222 among the plurality of IO patterns 221-227, and extends from inside the boundary 210 of the circuit region 200 to outside the boundary 210 where the extension pattern 322 overlaps and is electrically coupled to the second via 326. As described with respect to FIG. 3A, the extension pattern 322 extends transversely to and overlaps the further pattern 324, and the access pattern 311 and the further pattern 324 form an acute angle therebetween. In at least one embodiment, one or more advantages described herein are achievable in the IC device manufactured in accordance with the method 700B.

Figure 8:
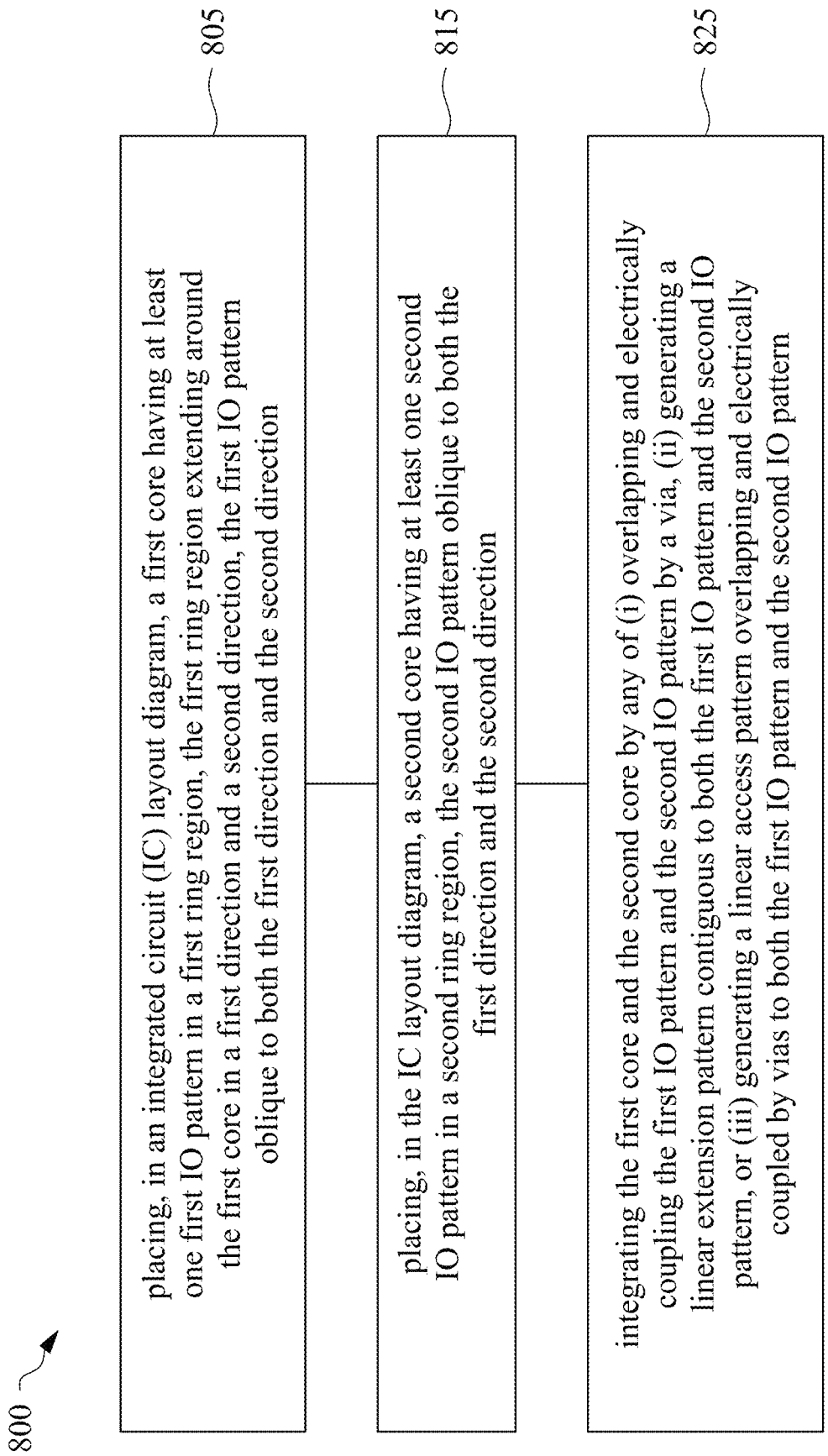
FIG. 8 is a flow chart of a method, in accordance with some embodiments.

FIG. 8 is a flow chart of a method 800, in accordance with some embodiments. In at least one embodiment, method 800 is performed in whole or in part by a processor as described herein. In at least one embodiment, the method 800 is a method for integrating cores in an IC layout diagram.

At operation 805, a first core is placed in an integrated circuit (IC) layout diagram. The first core has at least one first IO pattern in a first ring region, which extends around the first core in a first direction and a second direction. The first IO pattern is oblique to both the first direction and the second direction. For example, the APR tool is configured to place a core 400 in an IC layout diagram. As described with respect to FIG. 4A, the core 400 has one or more IO patterns 413-416 in a ring region 412, which extends around the core 400 in the X-X' direction and Y-Y' direction. The IO patterns 413-416 are oblique to both the X-X' direction and the Y-Y' direction.

At operation 815, a second core is placed in the IC layout diagram. The second core has at least one second IO pattern in a second ring region, and the second IO pattern is oblique to both the first direction and the second direction. For example, the APR tool is configured to place a core 400' in an IC layout diagram. As described with respect to FIG. 5A, the core 400' has one or more IO patterns 413'-416' in a ring region 412', and the IO patterns 413'-416' are oblique to both the X-X' direction and the Y-Y' direction.

At operation 825, the first core and the second core are integrated in any of several arrangements. In a first arrangement, the first core and the second core are integrated by overlapping the first IO pattern and the second IO pattern, and electrically coupling them by a via. For example, as described with respect to FIGS. 5A, 5C, 5E, the cores 400, 400' are integrated by overlapping, and electrically coupling using a via, one or more of the first IO patterns 413-416 of the core 400 and corresponding one or more of the second IO patterns 413'-416' of the core 400'.

In a second arrangement, the first core and the second core are integrated by generating a linear extension pattern contiguous to both the first IO pattern and the second IO pattern. For example, as described with respect to FIG. 5D, the APR tool is configured to generate linear extension patterns 563 each contiguous to a first IO pattern 413 and the corresponding second IO pattern 414'. As a result, the first IO pattern 413 and the corresponding second IO pattern 414' are electrically coupled, which corresponds to integrating the cores 400, 400'.

In a third arrangement, the first core and the second core are integrated by generating a linear access pattern overlapping and electrically coupled by vias to both the first IO pattern and the second IO pattern. For example, as described with respect to FIG. 5D, the APR tool is configured to generate linear access patterns 565 each overlapping and electrically coupled by vias 566, 567 to a first IO pattern 416 and the corresponding second IO pattern 415'. As a result, the first IO pattern 416 and the corresponding second IO pattern 415' are electrically coupled, which corresponds to integrating the cores 400, 400'. In at least one embodiment, all operations 805, 815, 825 are automatically performed without user input or intervention.

The described methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

In some embodiments, at least one method(s) discussed above is performed in whole or in part by at least one EDA system. In some embodiments, an EDA system is usable as part of a design house of an IC manufacturing system discussed below.

Figure 9:
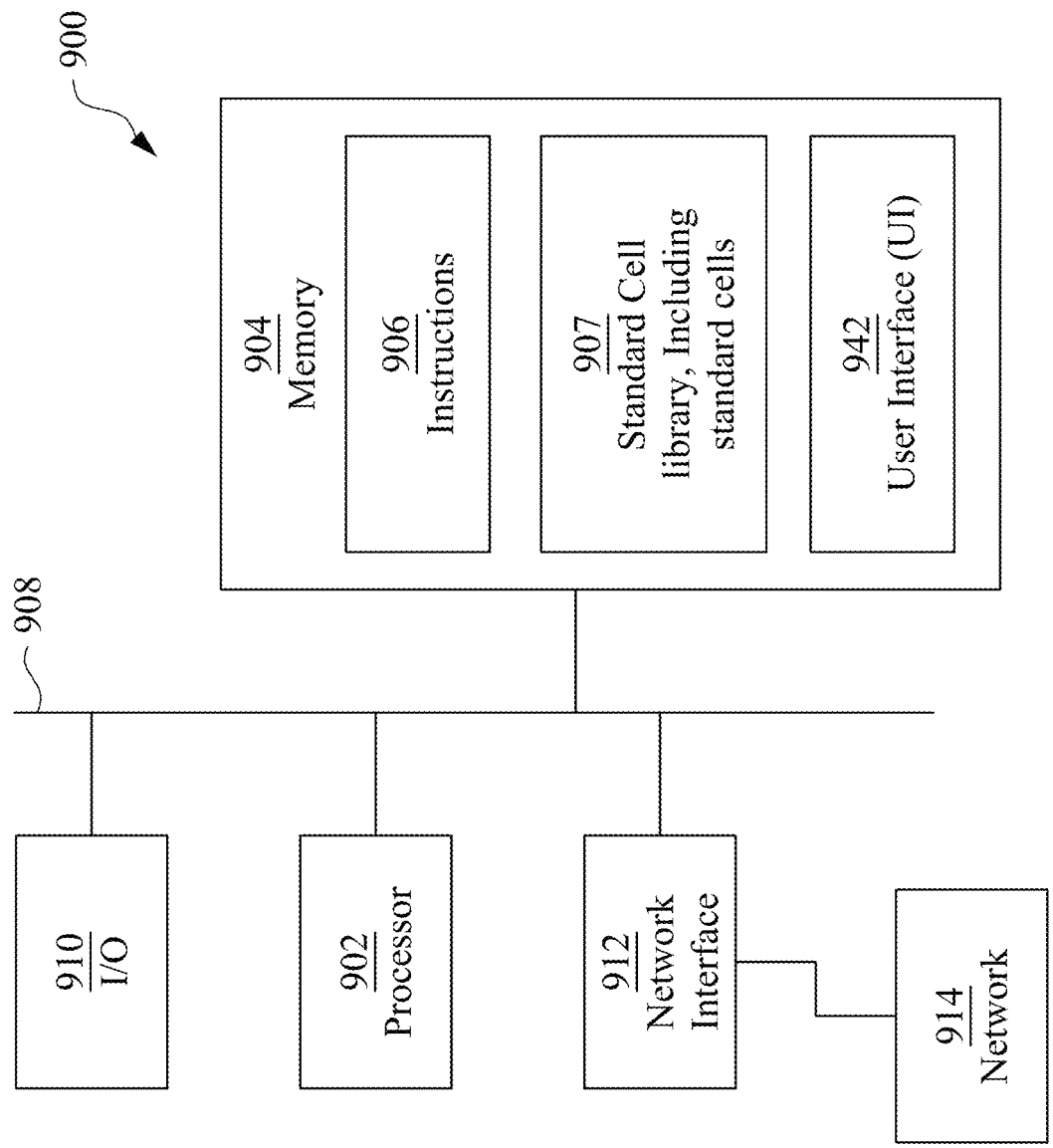
FIG. 9 is a block diagram of an electronic design automation (EDA) system, in accordance with some embodiments.

FIG. 9 is a block diagram of an electronic design automation (EDA) system 900 in accordance with some embodiments.

In some embodiments, EDA system 900 includes an APR system. Methods described herein of designing layout diagrams represent wire routing arrangements, in accordance with one or more embodiments, are implementable, for example, using EDA system 900, in accordance with some embodiments.

In some embodiments, EDA system 900 is a general purpose computing device including a hardware processor 902 and a non-transitory, computer-readable storage medium 904. Storage medium 904, amongst other things, is encoded with, i.e., stores, computer program code 906, i.e., a set of executable instructions. Execution of instructions 906 by hardware processor 902 represents (at least in part) an EDA tool which implements a portion or all of the methods described herein in accordance with one or more embodiments (hereinafter, the noted processes and/or methods).

Processor 902 is electrically coupled to computer-readable storage medium 904 via a bus 908. Processor 902 is also electrically coupled to an I/O interface 910 by bus 908. A network interface 912 is also electrically connected to processor 902 via bus 908. Network interface 912 is connected to a network 914, so that processor 902 and computer-readable storage medium 904 are capable of connecting to external elements via network 914. Processor 902 is configured to execute computer program code 906 encoded in computer-readable storage medium 904 in order to cause system 900 to be usable for performing a portion or all of the noted processes and/or methods. In one or more embodiments, processor 902 is a central processing unit (CPU), a multi-processor, a distributed processing system, an application specific integrated circuit (ASIC), and/or a suitable processing unit.

In one or more embodiments, computer-readable storage medium 904 is an electronic, magnetic, optical, electromagnetic, infrared, and/or a semiconductor system (or apparatus or device). For example, computer-readable storage medium 904 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 904 includes a compact disk-read only memory (CD-ROM), a compact disk-read/write (CD-R/W), and/or a digital video disc (DVD).

In one or more embodiments, storage medium 904 stores computer program code 906 configured to cause system 900 (where such execution represents (at least in part) the EDA tool) to be usable for performing a portion or all of the noted processes and/or methods. In one or more embodiments, storage medium 904 also stores information which facilitates performing a portion or all of the noted processes and/or methods. In one or more embodiments, storage medium 904 stores library 907 of standard cells including such standard cells as disclosed herein.

EDA system 900 includes I/O interface 910. I/O interface 910 is coupled to external circuitry. In one or more embodiments, I/O interface 910 includes a keyboard, keypad, mouse, trackball, trackpad, touchscreen, and/or cursor direction keys for communicating information and commands to processor 902.

EDA system 900 also includes network interface 912 coupled to processor 902. Network interface 912 allows system 900 to communicate with network 914, to which one or more other computer systems are connected. Network interface 912 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 900.

System 900 is configured to receive information through I/O interface 910. The information received through I/O interface 910 includes one or more of instructions, data, design rules, libraries of standard cells, and/or other parameters for processing by processor 902. The information is transferred to processor 902 via bus 908. EDA system 900 is configured to receive information related to a UI through I/O interface 910. The information is stored in computer-readable medium 904 as user interface (UI) 942.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 900. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 10:
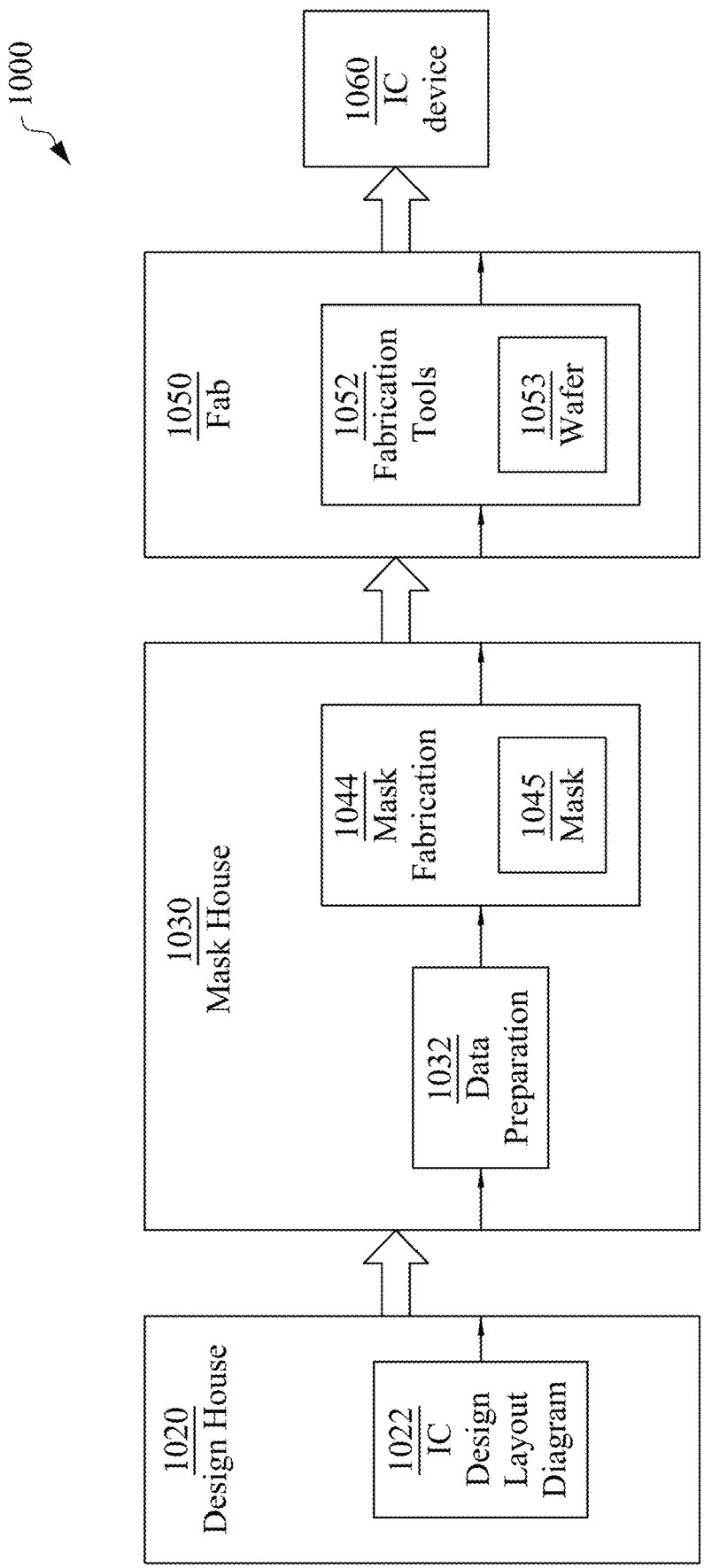
FIG. 10 is a block diagram of an IC manufacturing system and an IC manufacturing flow associated therewith, in accordance with some embodiments.

FIG. 10 is a block diagram of an integrated circuit (IC) manufacturing system 1000, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1000.

In FIG. 10, IC manufacturing system 1000 includes entities, such as a design house 1020, a mask house 1030, and an IC manufacturer/fabricator ("fab") 1050, that interact with one another in the design, development, and manufacturing cycles and/or services related to manufacturing an IC device 1060. The entities in system 1000 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1020, mask house 1030, and IC fab 1050 is owned by a single larger company. In some embodiments, two or more of design house 1020, mask house 1030, and IC fab 1050 coexist in a common facility and use common resources.

Design house (or design team) 1020 generates an IC design layout diagram 1022. IC design layout diagram 1022 includes various geometrical patterns designed for an IC device 1060. The geometrical patterns correspond to patterns of metal, oxide, or semiconductor layers that make up the various components of IC device 1060 to be fabricated. The various layers combine to form various IC features. For example, a portion of IC design layout diagram 1022 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1020 implements a proper design procedure to form IC design layout diagram 1022. The design procedure includes one or more of logic design, physical design or place-and-route operation. IC design layout diagram 1022 is presented in one or more data files having information of the geometrical patterns. For example, IC design layout diagram 1022 can be expressed in a GDSII file format or DFII file format.

Mask house 1030 includes data preparation 1032 and mask fabrication 1044. Mask house 1030 uses IC design layout diagram 1022 to manufacture one or more masks 1045 to be used for fabricating the various layers of IC device 1060 according to IC design layout diagram 1022. Mask house 1030 performs mask data preparation 1032, where IC design layout diagram 1022 is translated into a representative data file ("RDF"). Mask data preparation 1032 provides the RDF to mask fabrication 1044. Mask fabrication 1044 includes a mask writer. A mask writer converts the RDF to an image on a substrate, such as a mask (reticle) 1045 or a semiconductor wafer 1053. The design layout diagram 1022 is manipulated by mask data preparation 1032 to comply with particular characteristics of the mask writer and/or requirements of IC fab 1050. In FIG. 10, mask data preparation 1032 and mask fabrication 1044 are illustrated as separate elements. In some embodiments, mask data preparation 1032 and mask fabrication 1044 can be collectively referred to as mask data preparation.

In some embodiments, mask data preparation 1032 includes optical proximity correction (OPC) which uses lithography enhancement techniques to compensate for image errors, such as those that can arise from diffraction, interference, other process effects and the like. OPC adjusts IC design layout diagram 1022. In some embodiments, mask data preparation 1032 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1032 includes a mask rule checker (MRC) that checks the IC design layout diagram 1022 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1022 to compensate for limitations during mask fabrication 1044, which may undo part of the modifications performed by OPC in order to meet mask creation rules.

In some embodiments, mask data preparation 1032 includes lithography process checking (LPC) that simulates processing that will be implemented by IC fab 1050 to fabricate IC device 1060. LPC simulates this processing based on IC design layout diagram 1022 to create a simulated manufactured device, such as IC device 1060. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1022.

It should be understood that the above description of mask data preparation 1032 has been simplified for the purposes of clarity. In some embodiments, data preparation 1032 includes additional features such as a logic operation (LOP) to modify the IC design layout diagram 1022 according to manufacturing rules. Additionally, the processes applied to IC design layout diagram 1022 during data preparation 1032 may be executed in a variety of different orders.

After mask data preparation 1032 and during mask fabrication 1044, a mask 1045 or a group of masks 1045 are fabricated based on the modified IC design layout diagram 1022. In some embodiments, mask fabrication 1044 includes performing one or more lithographic exposures based on IC design layout diagram 1022. In some embodiments, an electron-beam (e-beam) or a mechanism of multiple e-beams is used to form a pattern on a mask (photomask or reticle) 1045 based on the modified IC design layout diagram 1022. Mask 1045 can be formed in various technologies. In some embodiments, mask 1045 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1045 includes a transparent substrate (e.g., fused quartz) and an opaque material (e.g., chromium) coated in the opaque regions of the binary mask. In another example, mask 1045 is formed using a phase shift technology. In a phase shift mask (PSM) version of mask 1045, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1044 is used in a variety of processes. For example, such a mask(s) is used in an ion implantation process to form various doped regions in semiconductor wafer 1053, in an etching process to form various etching regions in semiconductor wafer 1053, and/or in other suitable processes.

IC fab 1050 is an IC fabrication business that includes one or more manufacturing facilities for the fabrication of a variety of different IC products. In some embodiments, IC Fab 1050 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1050 includes fabrication tools 1052 configured to execute various manufacturing operations on semiconductor wafer 1053 such that IC device 1060 is fabricated in accordance with the mask(s), e.g., mask 1045. In various embodiments, fabrication tools 1052 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1050 uses mask(s) 1045 fabricated by mask house 1030 to fabricate IC device 1060. Thus, IC fab 1050 at least indirectly uses IC design layout diagram 1022 to fabricate IC device 1060. In some embodiments, semiconductor wafer 1053 is fabricated by IC fab 1050 using mask(s) 1045 to form IC device 1060. In some embodiments, the IC fabrication includes performing one or more lithographic exposures based at least indirectly on IC design layout diagram 1022. Semiconductor wafer 1053 includes a silicon substrate or other proper substrate having material layers formed thereon. Semiconductor wafer 1053 further includes one or more of various doped regions, dielectric features, multi-level interconnects, and the like (formed at subsequent manufacturing steps).

Details regarding an integrated circuit (IC) manufacturing system (e.g., system 1000 of FIG. 10), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, an integrated circuit (IC) device comprises a substrate and a circuit region over the substrate. The circuit region comprises at least one active region extending along a first direction, at least one gate region extending across the at least one active region and along a second direction transverse to the first direction, and at least one first input/output (IO) pattern configured to electrically couple the circuit region to external circuitry outside the circuit region. The at least one first IO pattern extends along a third direction oblique to both the first direction and the second direction.

In some embodiments, an integrated circuit (IC) device comprises a substrate, a first core region over the substrate, a first ring region over the substrate and surrounding the first core region, and at least one first input/output (IO) pattern in the first ring region. The first core region comprises at least one active region extending along a first direction, and at least one gate region extending across the at least one active region and along a second direction transverse to the first direction. The first IO pattern is configured to electrically couple the first core region to external circuitry outside the first core region. The at least one first IO pattern extends along a third direction oblique to both the first direction and the second direction.

In some embodiments, a method comprises forming a circuit region over a substrate, the circuit region corresponding to an intellectual property (IP) block. The circuit region comprises a boundary, and a plurality of input/output (IO) patterns inside the boundary. The method further comprises forming a first via over and electrically coupled to a first IO pattern among the plurality of IO patterns of the circuit region. The method further comprises forming, in a first metal layer over the first via, an access pattern which extends from outside the boundary of the circuit region to inside the boundary to overlap and electrically contact the first via. The access pattern and the first IO pattern form an acute angle therebetween.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) device, comprising:
a substrate; and
a circuit region over the substrate, the circuit region comprising:
at least one active region extending along a first direction;
at least one gate region extending across the at least one active region and along a second direction transverse to the first direction; and
at least one first input/output (IO) pattern configured to electrically couple the circuit region to external circuitry outside the circuit region,
wherein
the at least one first IO pattern extends along a third direction oblique to both the first direction and the second direction,
the circuit region has a boundary, and
the at least one first IO pattern is completely arranged within the boundary of the circuit region.

2. The IC device of claim 1, further comprising:
a first metal layer over the at least one active region, and comprising the at least one first IO pattern;
a second metal layer over the at least one active region, and comprising an access pattern which extends along the first direction or the second direction, from outside the boundary of the circuit region to inside the boundary to overlap the at least one first IO pattern; and
a via electrically coupling the access pattern to the at least one first IO pattern.

3. The IC device of claim 1, further comprising:
a first metal layer over the at least one active region, and comprising the at least one first IO pattern and an extension pattern, the extension pattern contiguous to the at least one first IO pattern and extending from inside the boundary of the circuit region to outside the boundary;
a second metal layer over the at least one active region, and comprising a further pattern which extends along a fourth direction to overlap the extension pattern; and
a via electrically coupling the further pattern to the extension pattern,
wherein
the fourth direction is oblique to both the first direction and the second direction, and is transverse to the third direction, and
the further pattern is an IO pattern of a further circuit region.

4. The IC device of claim 1, wherein the at least one first IO pattern comprises a plurality of first IO patterns, the IC device further comprising:
a first metal layer over the at least one active region, and comprising the plurality of first IO patterns;
a second metal layer over the at least one active region, and comprising an access pattern which extends along the first direction or the second direction, across an entire width or height of the circuit region to overlap the plurality of first IO patterns; and
a plurality of vias electrically coupling the access pattern correspondingly to the plurality of first IO patterns.

5. The IC device of claim 1, wherein the at least one first IO pattern comprises a plurality of first IO patterns, the IC device further comprising:
a first metal layer over the at least one active region, and comprising the plurality of first IO patterns;
a second metal layer over the at least one active region, and comprising a further pattern which extends along a fourth direction oblique to both the first direction and the second direction, the fourth direction transverse to the third direction;
an extension pattern in the first metal layer, the extension pattern contiguous to one first IO pattern among the plurality of first IO patterns and extending from inside the boundary of the circuit region to outside the boundary to overlap the further pattern;
a first via electrically coupling the further pattern to the extension pattern;
a third metal layer over the at least one active region, and comprising an access pattern which extends along the first direction or the second direction from outside the boundary of the circuit region to inside the boundary to overlap a further first IO pattern among the plurality of first IO patterns; and
a second via electrically coupling the access pattern to the further first IO pattern.

6. The IC device of claim 1, further comprising:
a first metal layer and a second metal layer over the at least one active region,
wherein
the first metal layer comprises the at least one first IO pattern,
the circuit region further comprises, in the second metal layer, at least one second IO pattern configured to electrically couple the circuit region to external circuitry outside the circuit region, and
the at least one second IO pattern extends along a fourth direction oblique to both the first direction and the second direction, the fourth direction transverse to the third direction.

7. The IC device of claim 6, wherein
the fourth direction is oblique to the third direction.

8. The IC device of claim 1, wherein
the at least one first IO pattern comprises at least one of
a signal IO pattern configured to communicate a data signal to or from the circuit region, or
a power IO pattern configured to supply a power supply voltage to the circuit region.

9. An integrated circuit (IC) device, comprising:
a substrate;
a first core region over the substrate, the first core region comprising:
at least one active region extending along a first direction; and
at least one gate region extending across the at least one active region and along a second direction transverse to the first direction;
at least one first input/output (IO) pattern configured to electrically couple the first core region to external circuitry outside the first core region; and
at least one second IO pattern configured to electrically couple the first core region to external circuitry outside the first core region,
wherein
the at least one first IO pattern extends along a third direction oblique to both the first direction and the second direction,
the at least one second IO pattern extends along a fourth direction oblique to both the first direction and the second direction, the fourth direction transverse to the third direction,
the at least one first IO pattern is arranged in a first metal layer, and
the at least one second IO pattern is arranged in a second metal layer different from the first metal layer.

10. The IC device of claim 9, wherein
the at least one first IO pattern overlaps the at least one second IO pattern.

11. The IC device of claim 9, further comprising:
a first ring region over the substrate and surrounding the first core region, wherein the at least one first IO pattern is in the first ring region;
a second core region over the substrate;
a second ring region over the substrate, and surrounding the second core region; and
at least one third IO pattern in the second ring region and configured to electrically couple the second core region to external circuitry outside the second core region,
wherein
the at least one third IO pattern extends along the fourth direction,
the at least one third IO pattern is arranged in a metal layer different from the first metal layer,
the at least one first IO pattern overlaps the at least one third IO pattern, and
the IC device further comprises at least one via electrically coupling the at least one first IO pattern to the at least one third IO pattern.

12. The IC device of claim 11, wherein
the first ring region partially overlaps the second ring region, and
the first core region is adjacent the second core region in the first direction or the second direction.

13. The IC device of claim 9, further comprising:
a first ring region over the substrate and surrounding the first core region, wherein the at least one first IO pattern is in the first ring region;
a second core region over the substrate;
a second ring region over the substrate, and surrounding the second core region; and
at least one third IO pattern in the second ring region and configured to electrically couple the second core region to external circuitry outside the second core region,
wherein
the at least one third IO pattern extends along the third direction and is arranged in the same first metal layer as the at least one first IO pattern, and
the first metal layer further comprises at least one extension pattern extending along the third direction and contiguous to both the at least one first IO pattern and the at least one third IO pattern to electrically couple the first core region to the second core region.

14. The IC device of claim 9, further comprising:
a first ring region over the substrate and surrounding the first core region, wherein the at least one first IO pattern is in the first ring region;
a second core region over the substrate;
a second ring region over the substrate, and surrounding the second core region; and
at least one third IO pattern in the second ring region and configured to electrically couple the second core region to external circuitry outside the second core region,
wherein
the at least one third IO pattern extends along the third direction and is arranged in the same first metal layer as the at least one first IO pattern,
the IC device further comprises a further metal layer comprising at least one access pattern,
the at least one access pattern extends along the fourth direction to overlap both the at least one first IO pattern and the at least one third IO pattern, and
the IC device further comprises
a first via electrically coupling the access pattern to the at least one first IO pattern, and
a second via electrically coupling the access pattern to the at least one third IO pattern.

15. The IC device of claim 9, further comprising:
a first ring region over the substrate and surrounding the first core region, wherein the at least one first IO pattern is in the first ring region;
a further substrate;
a second core region over the further substrate;
a second ring region over the substrate, and surrounding the second core region; and at least one third IO pattern in the second ring region and configured to electrically couple the second core region to external circuitry outside the second core region, wherein the at least one third IO pattern extends along the fourth direction, the first core region and the second core region are stacked one on top another, the at least one third IO pattern is arranged in a metal layer different from the first metal layer, the at least one first IO pattern overlaps the at least one third IO pattern, and the IC device further comprises at least one via electrically coupling the at least one first IO pattern to the at least one third IO pattern.

16. The IC device of claim 9, further comprising:

a first ring region over the substrate and surrounding the first core region, wherein the at least one first IO pattern is in the first ring region;

a second core region over the substrate;

a second ring region over the substrate, and surrounding the second core region; and at least one third IO pattern in the second ring region and configured to electrically couple the second core region to external circuitry outside the second core region, wherein the at least one third IO pattern extends along the fourth direction, the at least one third IO pattern is arranged in a metal layer different from the first metal layer, and the IC device further comprises:

a further metal layer comprising an access pattern, the access pattern overlaps both the at least one first IO pattern and the at least one third IO pattern, a first via electrically coupling the access pattern to the at least one first IO pattern, and a second via electrically coupling the access pattern to the at least one third IO pattern.

17. An integrated circuit (IC) device, comprising:

a substrate;

a circuit region over the substrate, the circuit region corresponding to an intellectual property (IP) block, the circuit region comprising:

a boundary, and a plurality of input/output (IO) patterns inside the boundary;

a first via over and electrically coupled to a first IO pattern among the plurality of IO patterns of the circuit region;

a first metal layer over the first via, the first metal layer comprising an access pattern which extends from outside the boundary of the circuit region to inside the boundary to overlap and electrically contact the first via, wherein the access pattern and the first IO pattern form an acute angle therebetween;

a second metal layer over the substrate, the second metal layer comprising a further pattern outside the boundary of the circuit region;

a second via over and electrically coupled to the further pattern; and a third metal layer over the second via, the third metal layer comprising:

the plurality of IO patterns parallel to each other, and an extension pattern which is contiguous to a second IO pattern among the plurality of IO patterns, and extends from inside the boundary of the circuit region to outside the boundary where the extension pattern overlaps and is electrically coupled to the second via, wherein the extension pattern extends transversely to and overlaps the further pattern in the second metal layer, and the access pattern and the further pattern form an acute angle therebetween.

18. The IC device of claim 17, wherein the further pattern is an IO pattern of a further circuit region corresponding to a further IP block.

19. The IC device of claim 17, wherein the first IO pattern is completely arranged within the boundary of the circuit region.

20. The IC device of claim 17, wherein the plurality of IO patterns comprises at least one of a signal IO pattern configured to communicate a data signal to or from the circuit region, or a power IO pattern configured to supply a power supply voltage to the circuit region.

* * * * *